(12) United States Patent
Chen

(10) Patent No.: US 10,748,562 B1
(45) Date of Patent: Aug. 18, 2020

(54) THIRD ALTERNATIVE DESIGN FOR MAGNETIC RECORDING ASSISTED BY ONE OR TWO SPIN HALL EFFECT (SHE) LAYERS IN THE WRITE GAP

(71) Applicant: Headway Technologies, Inc., Milpitas, CA (US)

(72) Inventor: Wenyu Chen, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 16/680,888

(22) Filed: Nov. 12, 2019

(51) Int. Cl.
*G11B 5/37* (2006.01)
*G11B 5/31* (2006.01)
*G11B 5/127* (2006.01)
*G01R 33/09* (2006.01)

(52) U.S. Cl.
CPC .......... *G11B 5/3146* (2013.01); *G01R 33/093* (2013.01); *G11B 5/1278* (2013.01); *G11B 5/37* (2013.01); *G11B 5/374* (2013.01)

(58) Field of Classification Search
None
See application file for complete search history.

(56) References Cited

U.S. PATENT DOCUMENTS

| 6,785,092 | B2 | 8/2004 | Covington et al. |
| 6,809,899 | B1 | 10/2004 | Chen et al. |
| 6,954,340 | B2 | 10/2005 | Shukh et al. |
| 7,009,812 | B2 | 3/2006 | Hsu et al. |
| 7,589,600 | B2 | 9/2009 | Dimitrov et al. |
| 7,724,469 | B2 | 5/2010 | Gao et al. |

(Continued)

FOREIGN PATENT DOCUMENTS

| JP | 2002-133610 | 5/2002 |
| JP | 2002-298309 | 10/2002 |

(Continued)

OTHER PUBLICATIONS

Co-pending U.S. Pat. No. HT19-016, U.S. Appl. No. 16/563,147, filed Sep. 6, 2019, "Alternative Designs for Magnetic Recording Assisted by Two Spin Hall Effect (SHE) Layers in the Write Gap," by Wenyu Chen, 37 pages.

(Continued)

*Primary Examiner* — William J Klimowicz
(74) *Attorney, Agent, or Firm* — Saile Ackerman LLC; Stephen B. Ackerman

(57) ABSTRACT

A Spin Hall Effect (SHE) assisted magnetic recording device is disclosed wherein a stack of two SHE layers (SHE1 and SHE2) with an intermediate conductor layer is formed between a main pole (MP) trailing side and trailing shield (TS) bottom surface. SHE1 is a negative Spin Hall Angle (SHA) material while SHE2 is a positive SHA material. Current ($I_a$) flows from SHE1 across the conductor layer to SHE2. In one embodiment, spin polarized current in SHE1 applies spin transfer torque that tilts a local MP magnetization to a direction that enhances a MP write field, and spin polarized current in SHE2 generates spin transfer torque that tilts a local TS magnetization to a direction that increases the TS return field and improves bit error rate. In alternative embodiments, one of SHE1 and SHE2 is omitted so that only one of the MP write field and TS return field is enhanced.

11 Claims, 19 Drawing Sheets

(56) References Cited

U.S. PATENT DOCUMENTS

| | | | |
|---|---|---|---|
| 7,835,111 B2 | 11/2010 | Flint et al. | |
| 7,957,098 B2 | 6/2011 | Yamada et al. | |
| 7,963,024 B2 | 6/2011 | Neuhaus | |
| 7,978,442 B2 | 7/2011 | Zhang et al. | |
| 7,982,996 B2 | 7/2011 | Smith et al. | |
| 8,027,110 B1 | 9/2011 | Yamanaka et al. | |
| 8,064,244 B2 | 11/2011 | Zhang et al. | |
| 8,068,312 B2 | 11/2011 | Jiang et al. | |
| 8,154,825 B2 | 4/2012 | Takashita et al. | |
| 8,203,389 B1 | 6/2012 | Zhou et al. | |
| 8,264,792 B2 | 9/2012 | Bai et al. | |
| 8,270,112 B2 | 9/2012 | Funayama et al. | |
| 8,295,008 B1 | 10/2012 | Sasaki et al. | |
| 8,310,787 B1 | 11/2012 | Sasaki et al. | |
| 8,320,079 B2 | 11/2012 | Iwasaki et al. | |
| 8,427,781 B1 | 4/2013 | Sasaki et al. | |
| 8,446,690 B2 | 5/2013 | Alex et al. | |
| 8,462,461 B2 | 6/2013 | Braganca et al. | |
| 8,477,452 B2 | 7/2013 | Sasaki et al. | |
| 8,493,687 B2 | 7/2013 | Sasaki et al. | |
| 8,582,240 B1 | 11/2013 | Chen et al. | |
| 8,582,241 B1 | 11/2013 | Yu et al. | |
| 8,604,886 B2 | 12/2013 | Nikonov et al. | |
| 8,634,163 B2 | 1/2014 | Tanabe et al. | |
| 8,749,919 B2 | 6/2014 | Sasaki et al. | |
| 8,767,347 B1 | 7/2014 | Sasaki et al. | |
| 8,792,210 B2 | 7/2014 | de la Fuente et al. | |
| 9,142,228 B2 | 9/2015 | Fujita et al. | |
| 9,230,571 B1 | 1/2016 | Chen et al. | |
| 9,299,367 B1 | 3/2016 | Tang et al. | |
| 9,361,912 B1 | 6/2016 | Liu et al. | |
| 9,406,317 B1 | 8/2016 | Tang et al. | |
| 9,466,319 B1 | 10/2016 | Tang et al. | |
| 9,824,701 B2 | 11/2017 | Tang et al. | |
| 9,934,797 B2 | 4/2018 | Takahashi et al. | |
| 9,947,347 B1* | 4/2018 | Van Der Heijden | G11B 5/372 |
| 9,966,091 B2 | 5/2018 | Chen et al. | |
| 10,032,469 B2 | 7/2018 | Lim et al. | |
| 10,037,772 B2 | 7/2018 | Okamura et al. | |
| 10,079,057 B2 | 9/2018 | Ozbay et al. | |
| 10,141,037 B2 | 11/2018 | Ohsawa et al. | |
| 10,181,334 B1 | 1/2019 | Song et al. | |
| 10,210,888 B1 | 2/2019 | Li et al. | |
| 10,403,309 B2 | 9/2019 | Li et al. | |
| 10,490,216 B1 | 11/2019 | Chen et al. | |
| 10,559,318 B1* | 2/2020 | Chen | G11B 5/11 |
| 10,580,441 B1* | 3/2020 | Chen | G11B 5/6082 |
| 2002/0034043 A1 | 3/2002 | Okada et al. | |
| 2004/0150910 A1 | 8/2004 | Okada et al. | |
| 2005/0128637 A1 | 6/2005 | Johnston et al. | |
| 2005/0141137 A1 | 6/2005 | Okada et al. | |
| 2006/0044682 A1 | 3/2006 | Le et al. | |
| 2006/0087765 A1 | 4/2006 | Iwakura et al. | |
| 2006/0103978 A1 | 5/2006 | Takano et al. | |
| 2007/0177301 A1 | 8/2007 | Han et al. | |
| 2008/0013209 A1 | 1/2008 | Sasaki et al. | |
| 2008/0088972 A1 | 4/2008 | Sasaki et al. | |
| 2009/0059426 A1 | 3/2009 | Sasaki et al. | |
| 2009/0080106 A1 | 3/2009 | Shimizu et al. | |
| 2009/0128953 A1 | 5/2009 | Jiang et al. | |
| 2009/0296275 A1 | 12/2009 | Sasaki et al. | |
| 2010/0165517 A1 | 7/2010 | Araki et al. | |
| 2011/0211271 A1 | 9/2011 | Ng et al. | |
| 2012/0292723 A1 | 11/2012 | Luo et al. | |
| 2014/0071562 A1 | 3/2014 | Chen et al. | |
| 2014/0177092 A1 | 6/2014 | Katada et al. | |
| 2014/0226239 A1* | 8/2014 | Mihajlovic | G11B 5/374 360/112 |
| 2015/0043106 A1 | 2/2015 | Yamada et al. | |
| 2016/0218728 A1 | 7/2016 | Zhu | |
| 2017/0133044 A1 | 5/2017 | Lim et al. | |
| 2018/0075868 A1 | 3/2018 | Koui et al. | |

FOREIGN PATENT DOCUMENTS

| | | |
|---|---|---|
| JP | 2008-021398 | 1/2008 |
| JP | 2010-157303 | 7/2010 |

OTHER PUBLICATIONS

Co-pending U.S. Pat. No. HT19-007, U.S. Appl. No. 16/563,112, filed Sep. 6, 2019, "Alternative Designs for Magnetic Recording Assisted by a Single Spin Hall Effect (SHE) Layer in the Write Gap," by Wenyu Chen, 36 pages.

Co-pending U.S. Pat. No. HT18-048, U.S. Appl. No. 16/370,634, filed Mar. 29, 2019, "Magnetic Recording Assisted by Two Spin Hall Effect (SHE) Layers in the Write Gap," by Wenyu Chen, 46 pages.

Co-pending U.S. Pat. No. HT18-047, U.S. Appl. No. 16/370,613, filed Mar. 29, 2019, "Magnetic Recording Assisted by a Single Spin Hall Effect (SHE) Layer in the Write Gap," by Wenyu Chen, 41 pages.

PTO Office Action, U.S. Appl. No. 12/964,202, Applicant: Sasaki et al., Notification date: Nov. 28, 2012, 11 pages.

"The Feasibility of Magnetic Recording at 10 Terabits Per Square Inch on Conventional Media," by Roger Wood et al., IEEE Transactions on Magnetics, vol. 45, No. 2, Feb. 2009, pp. 917-923.

Microwave Assisted Magnetic Recording, by Jian-Gang Zhu et al., IEEE Transactions on Magnetics, vol. 44, No. 1, Jan. 1, 2008, pp. 125-131.

Nov. 13, 2012, Office Action issued in Japanese Patent Application No. 2011-149242, with English language translation.

Nov. 13, 2012, Office Action issued in Japanese Patent Application No. 2011-149243, with English language translation.

Nov. 13, 2012, Office Action issued in Japanese Patent Application No. 2011-149244, with English language translation.

"Spin-Torque Oscillator Based on Magnetic Tunnel Junction with a Perpendicularly Magnetized Free Layer and In-Plane Magnetized Polarizer," by Hitoshi Kubota, et al., 2013 The Japan Society of Applied Physics, Applied Physics Express 6 (2013) 103003, Sep. 27, 2013, pp. 1-3.

"High-Power Coherent Microwave Emission from Magnetic Tunnel Junction Nano-oscillators with Perpendicular Anisotropy," by Zhongming Zeng, et al, 2012 American Chemical Society, Jun. 4, 2012, vol. 6, No. 7, pp. 6115-6121.

"Spin-Torque Switching with the Giant Spin Hall Effect of Tantalum," by Luqiao Liu et al., Science May 4, 2012: vol. 336, Issue 6081, pp. 555-558, DOI: 10.1126/science.1218197.

D'Yakonov, M. I., Spin Hall Effect. Int. J. Mod. Phys. B 23, 2556-2565 (2009).

"Spin-Torque Ferromagnetic Resonance Induced by the Spin Hall Effect," by Luqiao Liu et al, Physical Review Letters, PRL 106, 036601 (2011), Jan. 21, 2011, pp. 1-4.

"Surface-Assisted Spin Hall Effect in Au Films with Pt Impurities," by B. Gu et al., Physical Review Letters, PRL 105, 216401 (2010), Nov. 19, 2010, pp. 1-4.

* cited by examiner

US 10,748,562 B1

THIRD ALTERNATIVE DESIGN FOR MAGNETIC RECORDING ASSISTED BY ONE OR TWO SPIN HALL EFFECT (SHE) LAYERS IN THE WRITE GAP

RELATED PATENT APPLICATIONS

This application is related to the following: Ser. No. 16/209,151, filed on Dec. 4, 2018; Ser. No. 16/370,634, filed on Mar. 29, 2019; Ser. No. 16/563,112, filed on Sep. 6, 2019; and Ser. No. 16/563,147, filed on Sep. 6, 2019; assigned to a common assignee, and herein incorporated by reference in their entirety.

TECHNICAL FIELD

The present disclosure relates to a Spin Hall Effect assisted magnetic recording (SHAMR) structure wherein two Spin Hall Effect (SHE) layers called SHE1 and SHE2 that are separated by a conductor layer, and made of a negative and positive giant Spin Hall Angle (SHA) material, respectively, are formed in the write gap between a main pole (MP) and trailing shield (TS), and where a current ($I_a$) is applied from SHE1 across the conductor layer to SHE2 so that transverse spin transfer torque generated by spin polarized $I_a$ in SHE1 and by spin polarized $I_a$ in SHE2 causes a local MP magnetization at the MP/SHE1 interface to tilt and enhance a write field and causes a local TS magnetization at the SHE2/TS interface to tilt and enhance a return field, respectively, thereby improving overwrite (OW) and bit error rate (BER) and reliability, and providing a more easily implemented process compared with SHAMR designs where a current is applied across each SHE layer and synchronized with a write current ($I_w$).

BACKGROUND

As the data areal density in hard disk drive (HDD) writing increases, write heads and media bits are both required to be made in smaller sizes. However, as the write head size shrinks, its writability degrades. To improve writability, new technology is being developed that assists writing to a media bit. Two main approaches currently being investigated are thermally assisted magnetic recording (TAMR) and microwave assisted magnetic recording (MAMR) where a spin torque device is employed in the write gap to generate a high frequency field that helps writing. The latter is described by J-G. Zhu et al. in "Microwave Assisted Magnetic Recording", IEEE Trans. Magn., vol. 44, pp. 125-131 (2008). A third approach called STRAMR (spin torque reversal assisted magnetic recording) relies on spin torque to reverse a magnetization in a layer in the write gap (WG), for example, to increase reluctance and force more magnetic flux from the MP at the ABS. STRAMR is described in U.S. Pat. No. 6,785,092. Related patent application Ser. No. 16/209,151 describes a writer where the MAMR and STRAMR (spin flipping element) effects may exist simultaneously.

Spin transfer torque devices (also known as STO devices) are based on a spin-transfer effect that arises from the spin dependent electron transport properties of ferromagnetic-spacer-ferromagnetic multilayers. When current passes through a magnetic multilayer in a CPP (current perpendicular to plane) configuration, the first ferromagnetic layer (FM1) will generate spin polarized currents as the electrons traverse FM1. When the spin polarized current is transmitted through a polarization preservation spacer, the spin angular moment of electrons incident on a second FM layer (FM2) interacts with magnetic moments of FM2 near the interface between the non-magnetic spacer and FM2. Through this interaction, the electrons transfer a portion of their angular momentum to FM2. As a result, spin-polarized current can switch the magnetization direction of FM2 if the current density is sufficiently high.

Spin Hall Effect (SHE) is a physics phenomenon discovered in the mid $20^{th}$ century, and is described by M. Dyaknov et al. in Physics Lett. A, Vol. 35, 459 (1971). Similar to a regular Hall Effect where conduction carriers with opposite charges are scattered to opposite directions perpendicular to the current density due to a certain scattering mechanism, SHE causes electrons with opposite spins to be scattered to opposite directions perpendicular to the charge current density as a result of strong spin-orbit coupling in the conducting layer. As shown in FIG. 1, electrons pass through a non-magnetic conductor 2 with strong spin orbit interaction, and electrons 3a with spin in the negative x-axis direction are deflected to the +z-axis surface 2s1 while electrons 3b with spin in the positive x-axis direction are deflected to the negative z-axis surface 2s2. SHE is quantified by the Spin Hall Angle (SHA) defined as the ratio of the spin current in the direction transverse to the charge current (z-axis in FIG. 1) to the charge current (y-axis direction in FIG. 1). For many years after SHE was discovered, the absolute value of SHA materials evaluated was typically less than 0.01, and SHE had very limited application in industry.

During the past 10 years, materials with substantially larger (giant) SHA have been found. B. Gu et al. in Phys. Rev. Lett. 105, 216401 (2010), and L. Liu et al. in Phys. Rev. Lett. 106, 036601 (2011) provided examples of SHA~0.07 in a Pt layer, and as large as 0.12 in a Au layer with Pt doping, and an application where giant transverse spin current is injected into an adjacent magnetic layer to induce reversal and ferromagnetic resonance by spin torque. A large but negative SHA of around −0.12 was found in β-Ta, meaning that electrons in the β-Ta layer are spin scattered in the opposite directions compared to what is shown in FIG. 1. SHE with the negative SHA material was also used to interact with an adjacent magnetic layer, and even flip a magnetization in a magnetic layer in a magnetic random access memory (MRAM) device without sending a current through the magnetic tunnel junction. The aforementioned applications using SHE, or spin orbit torque (SOT) in MRAM, are typically called SOT-MRAM, and can significantly reduce the reliability concern that is generally found in conventional spin torque transfer (STT)-MRAM.

All existing designs that assist magnetic recording have advantages, but also have disadvantages including a greater number of pads per head for all assisted designs, reliability concern for TAMR, and a limited WG thickness to fit in a multilayer device in both MAMR and TAMR. In a first SHAMR design that we disclosed in related application Ser. No. 16/370,634, we found that applied current ($I_{SHE}$) that is confined within a SHE layer can cause heating that leads to SHE layer protrusion up to 1-2 nm out of the ABS. Furthermore, synchronization of $I_{SHE}$ with $I_w$ is difficult because of the required frequency in the GHz regime. To address the heating and synchronization issues, a second SHAMR design with SHE1 and SHE2 layers was disclosed in Ser. No. 16/563,147 where a first current ($I_1$) flows between the MP and SHE1, and a second current ($I_2$) flows between SHE2 and the TS. However, we subsequently found that while local charge current distribution at the MP/SHE1 and SHE2/TS interfaces provides a desirable assist proximate to the ABS, there may be a slightly negative assist from a back portion of the SHE layers that is greater than 20 nm from the ABS, for example. Therefore, a new SHE assist scheme is desired that solves all of the aforementioned concerns with earlier SHAMR designs while maintaining the benefits of the earlier schemes.

SUMMARY

One objective of the present disclosure is to provide a SHE assisted magnetic recording scheme that provides better overwrite (OW), bit error rate (BER), and transition sharpness compared with existing magnetic recording assist designs.

A second objective of the present disclosure is to provide the SHAMR scheme of the first objective that also delivers the assist at an ultra short time scale substantially less than 1 ns to meet the GHz recording requirement for HDD systems, and where spin current is injected into one or both of the MP and TS only in the assist direction along the entire SHE layer interfaces with the MP and TS.

A third objective of the present disclosure is to provide a SHAMR scheme that satisfies the first two objectives and also does not have a current threshold to begin the assist, and is compatible with various designs where write gap thickness may range from less than 10 nm to greater than 25 nm.

A fourth objective of the present disclosure is to provide a SHAMR scheme that satisfies the first three objectives, and does not require synchronization of a write current with a current through a SHE layer, and where SHE layer protrusion is avoided during a write process.

According to a first embodiment of the present disclosure, these objectives are achieved by forming a SHAMR device where two SHE layers are formed in a write gap (WG) and are separated with a conductive layer in a region extending from the ABS to a height k. The conductor is non-magnetic and has a SHA <0.05 and is preferably one of Ru, Ti, Zr, or Hf. A first SHE layer (SHE1) is made of a negative giant SHA material and has a bottom surface that interfaces with a MP trailing side from the ABS to height h1 while the second SHE layer (SHE2) is a positive giant SHA material and has a top surface that contacts a trailing shield (TS) from the ABS to height h2 where h1 and h2 are each between 10 nm and 70 nm and preferably greater than k. Each of SHE1 and SHE2 has a width greater than or equal to the track width of the MP trailing side at the ABS, but less than a full width of the shield structure.

A current ($I_a$) is applied from a direct current (dc) source through a first lead to SHE1 and flows across the conductor to SHE2 before returning through a second lead to the dc source. The direction of $I_a$ is independent of the direction of the MP write field. As a result, spin polarized current from SHE1 generates a transverse spin transfer torque that causes a local MP magnetization proximate to the MP/SHE1 interface to tilt to a direction that enhances the write field. The higher effective write field provides better overwrite. Moreover, spin polarized current from SHE2 generates a transverse spin transfer torque that causes a local TS magnetization proximate to the SHE2/TS interface to tilt to a direction that enhances the return field and thereby improves BER. Thus, spin polarized current from SHE1 is injected into the MP only in the assist direction that is toward the MP trailing side, and the SHE1 assist is substantially uniform along the entire MP/SHE1 interface. Similarly, spin polarized current from SHE2 is injected into the TS only in the assist direction that is toward the TS bottom surface, and the SHE2 assist is substantially uniform along the entire SHE2/TS interface.

In a second embodiment, the positions of SHE1 and SHE2 in the first embodiment are switched such that SHE1 (made of a negative giant SHA material) adjoins the TS bottom surface and injects spin polarized current into the TS to tilt the local TS magnetization to a direction that enhances the return field. SHE2 (made of a positive giant SHA material) contacts the MP trailing side and injects spin polarized current into the MP to tilt the local MP magnetization to a direction that enhances the write field. Again, the direction of Ia is from a dc source through a lead to SHE1 and then across the conductor to SHE2 before returning to the dc source through another lead.

According to a third embodiment, SHE2 in the first embodiment is replaced with an extension of the conductor layer so that Ia flows from SHE1 to the conductor and then back to the dc source through the second lead. Moreover, the conductor is completely separated from the TS by an upper portion of the WG so that the only SHE assist is from SHE1 to the MP to enhance the write field.

In a fourth embodiment, the first embodiment is modified by removal of SHE2 and extending the conductor from SHE1 to the TS bottom surface, and where the conductor has a uniform height k from the ABS. As a result, Ia flows from the dc source through the first lead to SHE1 and then across the conductor to the TS before returning through the second lead to the dc source. The only SHE assist is from SHE1 to the MP to enhance the write field.

In a fifth embodiment, SHE1 in the second embodiment is replaced with an extension of the conductor layer so that Ia flows from the dc source through a lead to the conductor, and then through SHE2 back to the dc source. The conductor is completely separated from the TS by the WG so that the only SHE assist is from SHE2 to the MP.

According to a sixth embodiment, the second embodiment is modified by removal of SHE1 and extending the conductor from SHE2 to the TS bottom surface. As a result, Ia flows from the dc source through a lead to the TS and then across the conductor to SHE2 before returning through another lead to the dc source. The only SHE assist is from SHE2 to the MP to enhance the write field.

In the seventh embodiment, SHE2 in the second embodiment is replaced with an extension of the conductor layer so that Ia flows from the dc source through SHE1 to the conductor and then returns to the dc source through a lead. Since the conductor is completely separated from the MP with a bottom portion of the WG, the only SHE assist is from SHE1 to the TS to boost the return field.

According to an eighth embodiment, the second embodiment is modified by removal of SHE2 and extending the conductor from SHE1 to the MP trailing side. As a result, Ia flows from the dc source through a lead to SHE1 and then across the conductor to the MP before returning through another lead to the dc source. The only SHE assist is from SHE1 to the TS to boost the return field.

In a ninth embodiment, SHE1 in the first embodiment is replaced with an extension of the conductor layer so that Ia flows from the dc source through the first lead to the conductor, and then through SHE2 back to the dc source. The conductor is completely separated from the MP by the WG so that the only SHE assist is from SHE2 to the TS.

According to the tenth embodiment, the first embodiment is modified by removal of SHE1 and extending the conductor from SHE2 to the MP trailing side. Thus, Ia flows from the dc source through the first lead to the MP and then across the conductor to SHE2 before returning through the second lead to the dc source. The only SHE assist is from SHE2 to the TS to boost the return field.

A process sequence is provided for forming a stack of layers comprised of SHE1, SHE2, and an intermediate conductor layer between the MP trailing side and TS bottom surface, and having a width less than a full width of the trailing shield.

BRIEF DESCRIPTION OF THE DRAWINGS

FIGS. 18A-18B are plots of local MP and TS magnetization tilt angles $\theta_1$ and $\theta_2$, respectively, as a function of time and current density for a SHAMR device disclosed herein while

DETAILED DESCRIPTION

Figure 1:
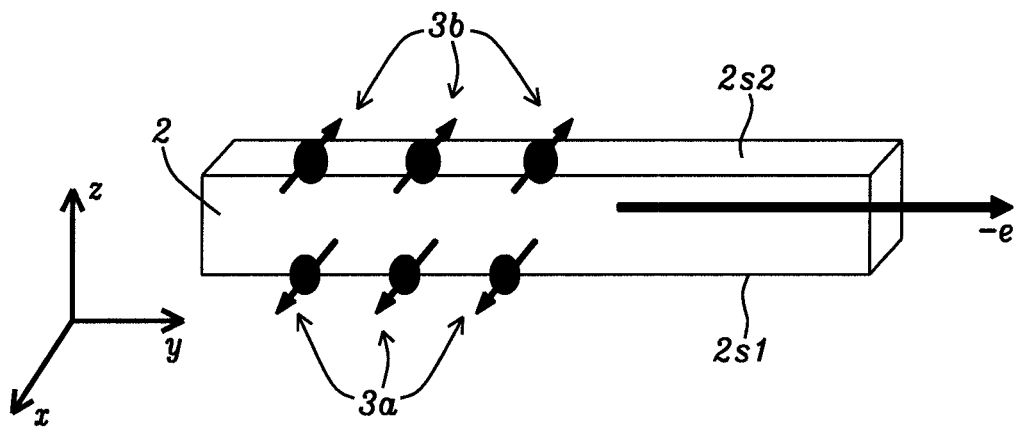
FIG. 1 is an oblique view of a conductor made of a Spin Hall Effect material where electrons with spin in the (−) x-axis direction are deflected to the (+) z-axis surface, and electrons with spin in the (+) x-axis direction are deflected to the (−) z-axis surface.

The present disclosure is a PMR writer wherein a SHAMR device is formed between a MP and TS, and the SHAMR device comprises a first SHE layer (SHE1) made of a negative giant SHA material, a second SHE layer (SHE2) made of a giant positive SHA material, and a conductor layer between SHE1 and SHE2. When current ($I_a$) is applied from SHE1 across the conductor layer to SHE2, transverse spin transfer torque is applied from SHE1 to one of a local MP magnetization and a local TS magnetization, and transverse spin transfer torque is applied from SHE2 to the other of the local MP magnetization and TS magnetization thereby enhancing the write field and return field. In the drawings, the y-axis is in a cross-track direction, the z-axis is in a down-track direction, and the x-axis is in a direction orthogonal to the ABS and towards a back end of the writer structure. Thickness refers to a down-track distance, width is a cross-track distance, and height is a distance orthogonal to the ABS in the x-axis direction. In some of the drawings, a magnetic bit is considerably enlarged over actual size in order to more easily depict a bit magnetization therein. The term "down" or "downward" with respect to MP write field and TS return field indicates a direction out of the ABS toward the magnetic medium, and the term "up" or "upward" refers to a direction that is into the MP (or TS) from the magnetic medium. A front side of a layer faces the ABS while a backside of a layer faces away from the ABS. A giant SHA material (positive or negative) is defined as a material having an absolute value for SHA that is ≥0.05.

Figure 2:
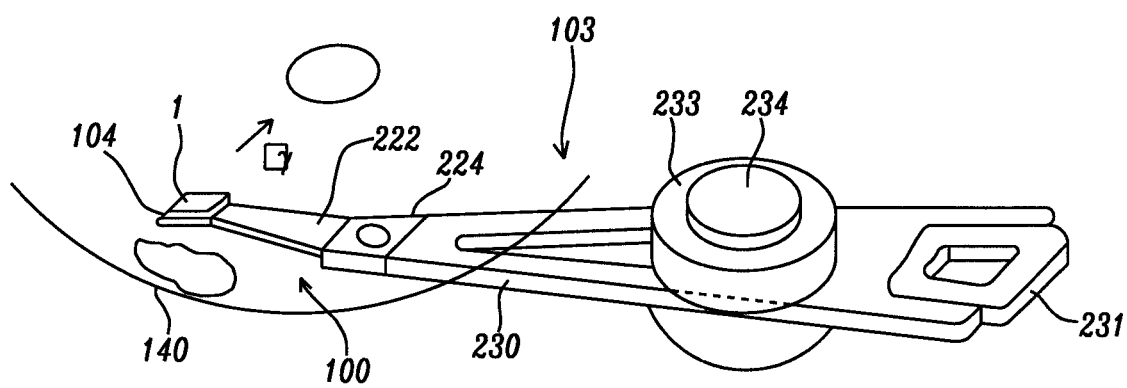
FIG. 2 is a perspective view of a head arm assembly of the present disclosure.

Referring to FIG. 2, a head gimbal assembly (HGA) 100 includes a magnetic recording head 1 comprised of a slider and a PMR writer structure formed thereon, and a suspension 103 that elastically supports the magnetic recording head. The suspension has a plate spring-like load beam 222 formed with stainless steel, a flexure 104 provided at one end portion of the load beam, and a base plate 224 provided at the other end portion of the load beam. The slider portion of the magnetic recording head is joined to the flexure, which gives an appropriate degree of freedom to the magnetic recording head. A gimbal part (not shown) for maintaining a posture of the magnetic recording head at a steady level is provided in a portion of the flexure to which the slider is mounted.

HGA 100 is mounted on an arm 230 formed in the head arm assembly 103. The arm moves the magnetic recording head 1 in the cross-track direction y of the magnetic recording medium 140. One end of the arm is mounted on base plate 224. A coil 231 that is a portion of a voice coil motor is mounted on the other end of the arm. A bearing part 233 is provided in the intermediate portion of arm 230. The arm is rotatably supported using a shaft 234 mounted to the bearing part 233. The arm 230 and the voice coil motor that drives the arm configure an actuator.

Figure 3:
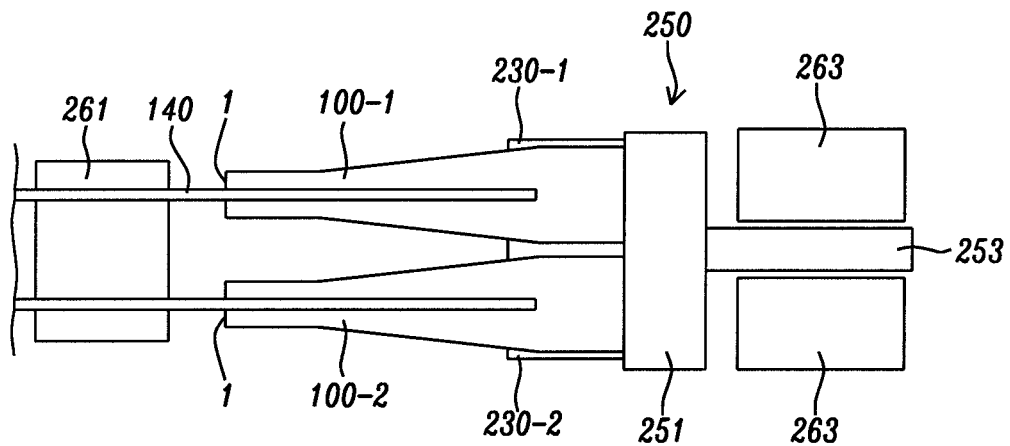
FIG. 3 is side view of a head stack assembly of the present disclosure.

Next, a side view of a head stack assembly (FIG. 3) and a plan view of a magnetic recording apparatus (FIG. 4) wherein the magnetic recording head 1 is incorporated are depicted. The head stack assembly 250 is a member to which a first HGA 100-1 and second HGA 100-2 are mounted to arms 230-1, 230-2, respectively, on carriage 251. A HGA is mounted on each arm at intervals so as to be aligned in the perpendicular direction (orthogonal to magnetic medium 140). The coil portion (231 in FIG. 2) of the voice coil motor is mounted at the opposite side of each arm in carriage 251. The voice coil motor has a permanent magnet 263 arranged at an opposite position across the coil 231.

Figure 4:
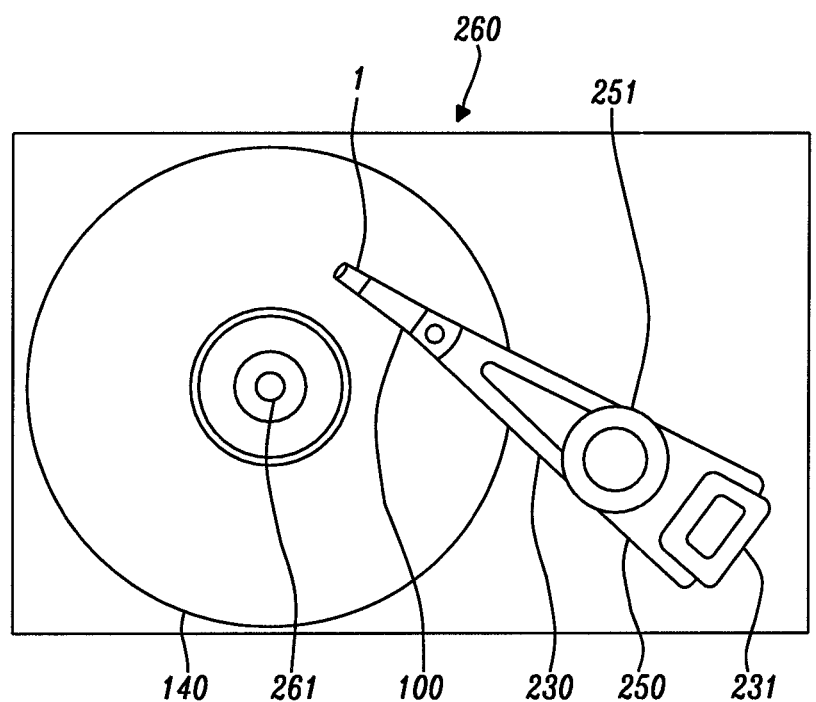
FIG. 4 is a plan view of a magnetic recording apparatus of the present disclosure.

With reference to FIG. 4, the head stack assembly 250 is incorporated in a magnetic recording apparatus 260. The magnetic recording apparatus has a plurality of magnetic media 140 mounted to spindle motor 261. For every magnetic recording medium, there are two magnetic recording heads arranged opposite one another across the magnetic recording medium. The head stack assembly and actuator except for the magnetic recording heads 1 correspond to a positioning device, and support the magnetic recording heads, and position the magnetic recording heads relative to the magnetic recording medium. The magnetic recording heads are moved in a cross-track of the magnetic recording medium by the actuator. The magnetic recording head records information into the magnetic recording media with a PMR writer element (not shown) and reproduces the information recorded in the magnetic recording media by a magnetoresistive (MR) sensor element (not shown).

Figure 5:
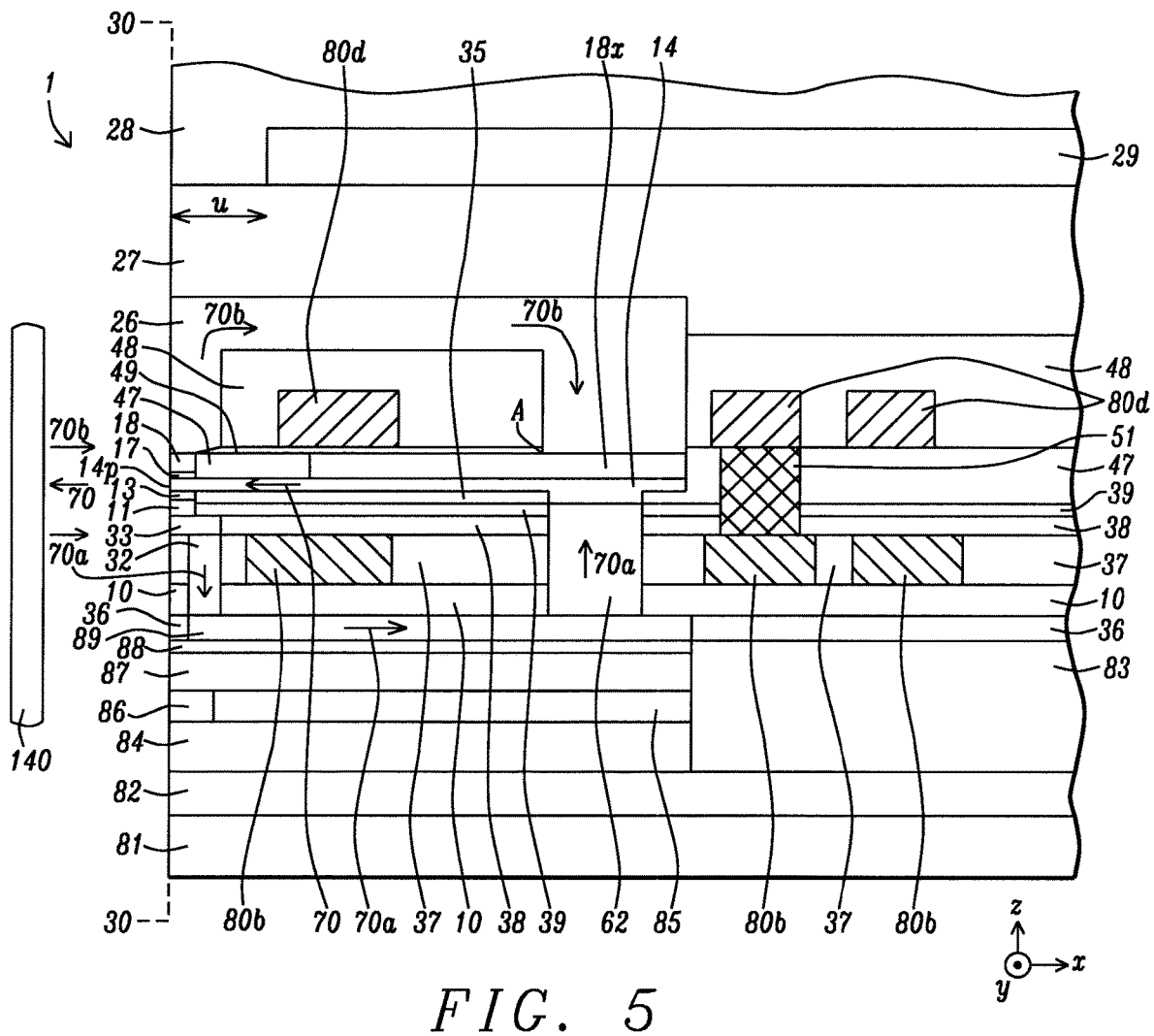
FIG. 5 is a down-track cross-sectional view of a combined read-write head with leading and trailing loop pathways for magnetic flux return to the main pole according to an embodiment of the present disclosure.

Referring to FIG. 5, magnetic recording head 1 comprises a combined read-write head. The down-track cross-sectional view is taken along a center plane (44-44 in FIG. 6A) formed orthogonal to the ABS 30-30, and that bisects the main pole layer 14. The read head is formed on a substrate 81 that may be comprised of AlTiC (alumina+TiC) with an overlying insulation layer 82 that is made of a dielectric material such as alumina. The substrate is typically part of a slider formed in an array of sliders on a wafer. After the combined read head/write head is fabricated, the wafer is sliced to form rows of sliders. Each row is typically lapped to afford an ABS before dicing to fabricate individual sliders that are used in a magnetic recording device. A bottom shield 84 is formed on insulation layer 82.

A magnetoresistive (MR) element also known as MR sensor 86 is formed on bottom shield 84 at the ABS 30-30 and typically includes a plurality of layers (not shown) including a tunnel barrier formed between a pinned layer and a free layer where the free layer has a magnetization (not shown) that rotates in the presence of an applied magnetic field to a position that is parallel or antiparallel to the pinned layer magnetization. Insulation layer 85 adjoins the backside of the MR sensor, and insulation layer 83 contacts the backsides of the bottom shield and top shield 87. The top shield is formed on the MR sensor. An insulation layer 88 and a top shield (S2B) layer 89 are sequentially formed on the top magnetic shield. Note that the S2B layer 89 may serve as a flux return path (RTP) in the write head portion of the combined read/write head. Thus, the portion of the combined read/write head structure formed below layer 89 in FIG. 4 is typically considered as the read head. In other embodiments (not shown), the read head may have a dual reader design with two MR sensors, or a multiple reader design with multiple MR sensors.

The present disclosure anticipates that various configurations of a write head (PMR writer with a SHAMR design) may be employed with the read head portion. In the exemplary embodiment, magnetic flux 70 in main pole (MP) layer 14 is generated with flowing a write current called $I_w$ (not shown) through bucking coil 80b and driving coil 80d that are below and above the MP layer, respectively, and are connected by interconnect 51. Magnetic flux (write field) 70 exits the MP layer at pole tip 14p at the ABS 30-30 and is used to write a plurality of bits on magnetic media 140. Magnetic flux (return field) 70b returns to the MP through a trailing loop comprised of trailing shield 17, write shield 18, PP3 shield 26, and top yoke 18x. There is also a leading return loop for magnetic flux 70a that includes leading shield 11, leading shield connector (LSC) 33, S2 connector (S2C) 32, return path 89, and back gap connection (BGC) 62. The magnetic core may also comprise a bottom yoke 35 below the MP layer. Dielectric layers 10, 13, 36-39, and 47-49 are employed as insulation layers around magnetic and electrical components. A protection layer 27 covers the uppermost (PP3) trailing shield and is made of an insulating material such as alumina. Above the protection layer and recessed a certain distance u from the ABS 30-30 is an optional cover layer 29 that is preferably comprised of a low coefficient of thermal expansion (CTE) material such as SiC. Overcoat layer 28 is formed as the uppermost layer in the write head.

Figure 6A:
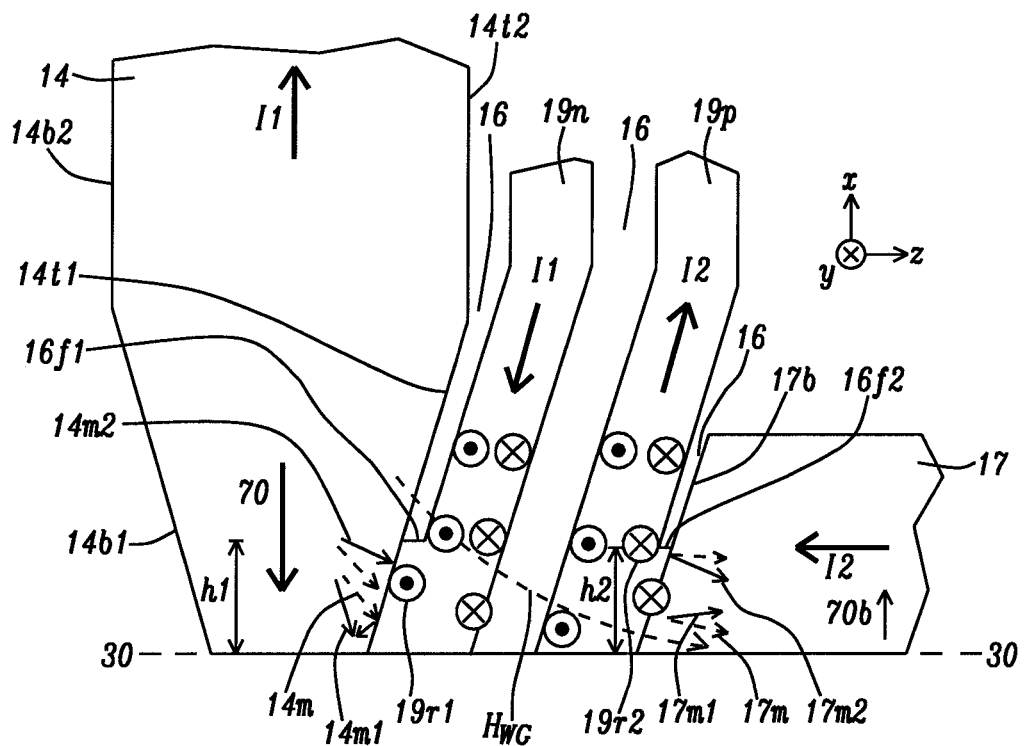
FIGS. 6A-6B are down-track cross-sectional views of a prior art PMR writer where the write field is pointing downward and upward, respectively, and current I1 flows from a SHE1 layer to the MP and current I2 flows from the TS to a SHE2 layer in the WG to generate a spin torque on local MP and TS magnetizations.
Figure 6B:
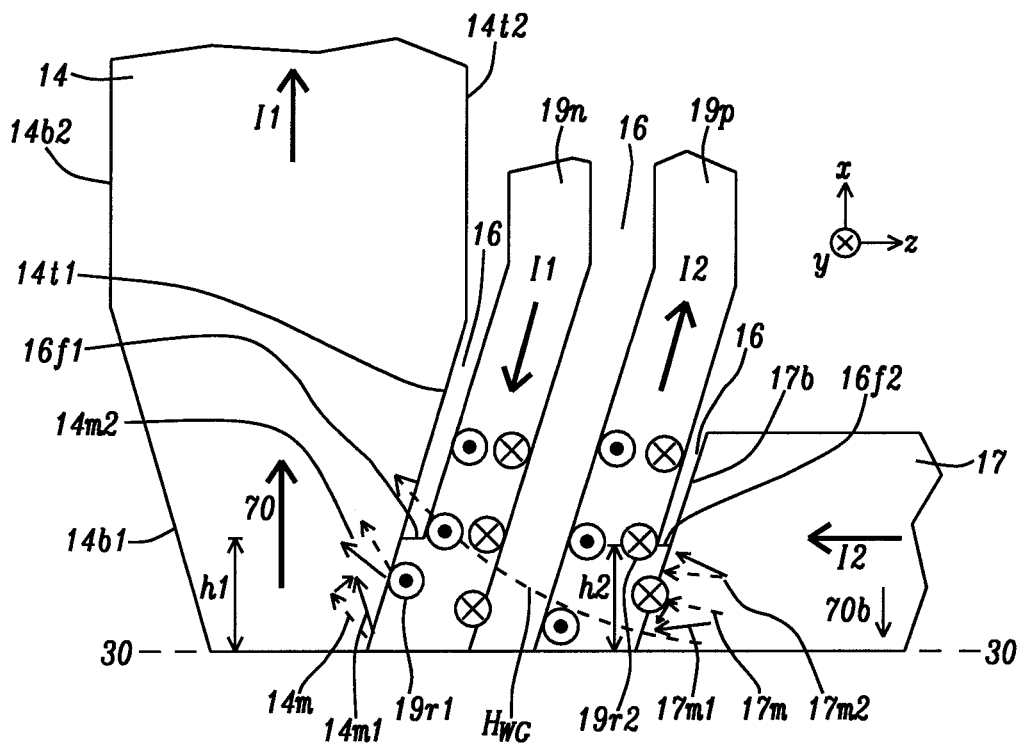

Referring to FIG. 6A and FIG. 6B, down-track cross-sectional views of a PMR write head with a SHAMR design previously disclosed in related patent application Ser. No. 16/563,147 are shown where write field 70 is pointing down and up, respectively, and return field 70b is in a direction opposite to that of the write field. MP trailing side 14t1 extends from the ABS 30-30 to MP top surface 14t2 that is oriented in a direction orthogonal to the ABS. MP leading side 14b1 extends from the ABS to MP bottom surface 14b2 that is parallel to the MP top surface.

Current I1 flows from SHE1 19n across a MP/SHE1 interface at MP trailing side 14t1 from the ABS 30-30 up to height h1, and then back through MP 14 to a dc source (not shown). Height h1 corresponds to front side 16f1 of WG 16 that separates a back portion of SHE1 from the MP. As a result of 11, the direction of spin polarized electrons 19r1 in SHE1 proximate to MP trailing side 14t1 is out of the plane of the paper and generates transverse spin transfer torque 19t1 that is substantially orthogonal to MP trailing side 14t1 and pointing toward the MP, and causes local MP magnetization 14m to tilt and become MP magnetization 14m1 that is oriented more downward and towards the ABS in FIG. 6A, and more upward in FIG. 6B. In each case, magnetization 14m1 is more parallel to the write field than magnetization 14m, which enhances the write field and improves overwrite (positive or desirable SHE assist). However, we have discovered that proximate to height h1, and typically at portions of the MP trailing side that are more than 20 nm from the ABS, there may be a negative or undesirable SHE assist where magnetization 14m is tilted to become magnetization 14m2 that is less parallel to write field 70. Note the terms "SHE assist" and "SHAMR assist" may be used interchangeably.

Current I2 flows from TS 17 across a SHE2/TS interface at TS bottom surface 17b to SHE2 19p from the ABS 30-30 up to height h2, and then back through SHE2 to the dc source (not shown). As a result of 12, the direction of spin polarized electrons 19r2 in SHE2 proximate to the TS bottom surface is into the plane of the paper and is responsible for generating transverse spin transfer torque 19t2 that is substantially orthogonal to the TS bottom surface and pointing toward the TS. Transverse spin transfer torque 19t2 causes local TS magnetization 17m to tilt and become magnetization 17m1 that is oriented more upward in FIG. 6A, and more downward in FIG. 6B. In each case, magnetization 17m1 is more parallel to the return field 70b than magnetization 17m, which enhances the return field and improves BER for a positive SHE assist. Unfortunately, there may be a negative SHE assist proximate to height h2, and typically at portions of the TS bottom surface that are more than 20 nm from the ABS, where magnetization 17m tilts to become magnetization 17m2 that is less parallel to return field 70b than magnetization 17m. In view of the possibility of generating the negative SHE assists represented by magnetizations 14m2 and 17m2, we were motivated to provide an improved SHAMR design that avoids this issue while maintaining all the benefits of the SHAMR designs described in the aforementioned related patent applications.

The present disclosure encompasses various SHAMR embodiments that effectively remove the possibility of the negative SHE assists mentioned with regard to FIGS. 6A-6B. According to a first embodiment of the present disclosure depicted in the ABS view in FIG. 7A, MP 14 has a side 14s that connects MP trailing side 14t1 to MP leading side 14b1 on each side of center plane 44-44 that bisects the MP trailing side. The MP trailing side has track width TW at plane 43-43 that is orthogonal to the center plane. A side gap 15 contacts each MP side, and each side shield (SS) 12 has an inner side adjoining a side gap, and an outer side 12s1 or 12s2. Leading shield 11 has top surface lit contacting a bottom of each side shield, and a bottom of lead gap 13. The lead gap fills the space between MP leading side 14b1 and the leading shield. A lower write gap (WG) layer 16a is formed on each SS top surface 12t while an upper WG layer 16d above plane 43-43 adjoins the sides 19s1 of SHE1 19n and sides 19s2 of SHE2 19p. In other embodiments (not shown), SS top surface 12t is at plane 43-43.

A key feature is that the earlier SHAMR design depicted in FIGS. 6A-6B is modified to include a conductor layer 20 between SHE1 and SHE2 and having the same width w as SHE1 and SHE2 where w≥TW but less than a full width of the shield structure that is the distance between sides 12s1 and 12s2. Preferably, w is from 30 nm to 150 nm. The SHAMR device comprised of layers 19n, 20, and 19p has a thickness d that represents the distance between the MP trailing side and TS bottom surface 17b at the ABS. Thickness d may range from less than 10 nm to greater than 25 nm. Preferably, each of SHE1 and SHE2 has a thickness less than 12 nm since the L. Liu reference mentioned earlier indicates that a SHE assist (transverse spin torque applied to an adjacent magnetic layer) is reduced when the giant SHA material has a thickness >12 nm. Conductor layer 20 is non-magnetic and is preferably a metal having an absolute value for SHA that is <0.05 such as Ru, Ti, Zr, and Hf.

Figure 7A:
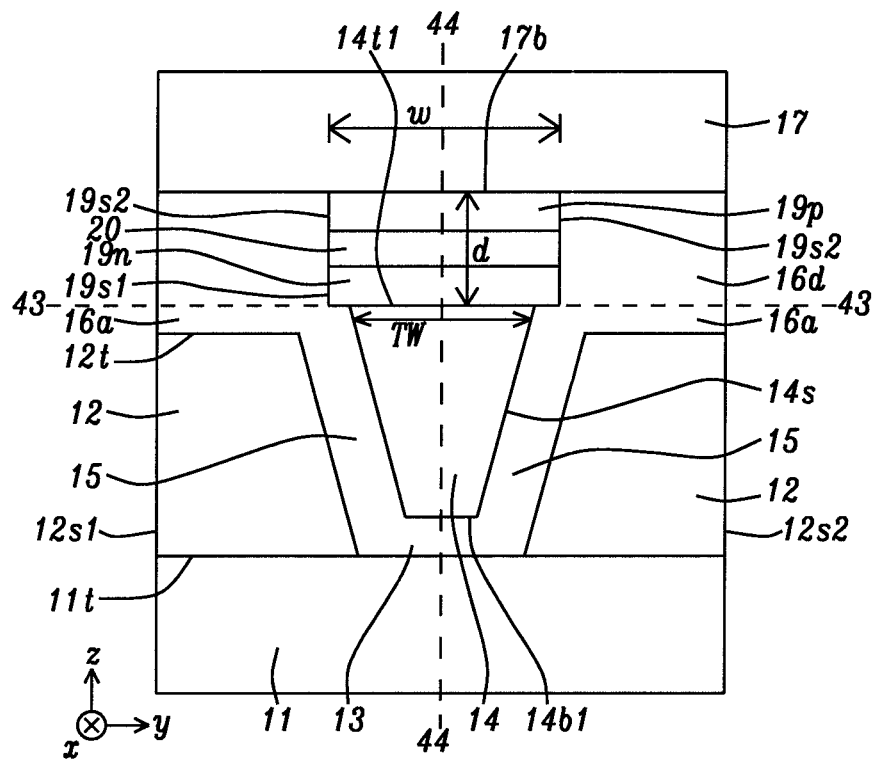
FIG. 7A is an ABS view.
Figure 7B:
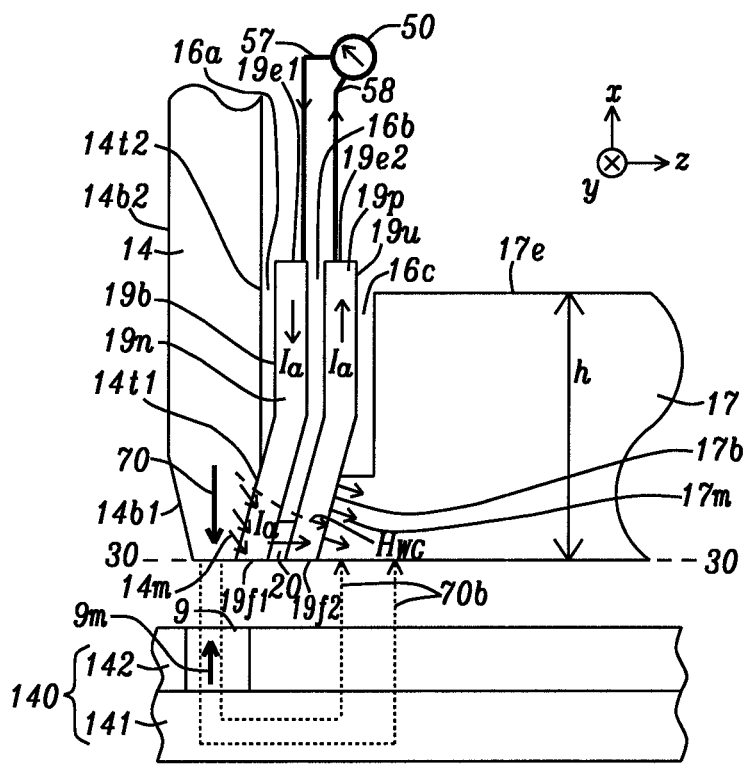
FIGS. 7B-7D are down-track cross-sectional views where current Ia flows from SHE1, which adjoins a MP trailing side, across a conductor to SHE2 that contacts a TS to enhance a write field and return field, respectively, according to a first embodiment of the present disclosure.

Referring to FIG. 7B, a down-track cross-sectional view is shown of the PMR writer in FIG. 7A that incorporates a SHAMR device. MP 14 has a sufficiently large magnetic (write) field 70 to write a media bit 9 with magnetization 9m on medium 140. In a normal write process, the MP needs to be driven with coil current Iw (not shown) so that the MP write field 70 is pointing down to overwrite a medium bit 9 pointing up. Magnetic flux in the MP write field proceeds from the MP through the ABS 30-30 and into medium bit layer 142 and soft underlayer (SUL) 141. A portion of the flux 70b is collected by trailing shield 17 and then returns to the MP through a trailing loop (shown in FIG. 5). SHE1 19n has a front side 19f1 at the ABS, and SHE2 19p has front side 19f2 at the ABS. A front portion of the SHE1 bottom surface 19b proximate to the ABS is formed on the MP tapered trailing side 14t1 to form a MP/SHE1 interface. The MP trailing side connects with MP top surface 14t2 that is aligned orthogonal to the ABS. The remainder of the SHE1 bottom surface is separated from the MP by WG 16a to prevent shorting. A front portion of SHE2 top surface 19u adjoins TS bottom surface 17b to form a SHE2/TS interface while the remainder of the SHE2 top surface is separated from the TS by WG layer 16c to avoid shorting. WG layer 16b is behind conductor layer 20 and separates a back portion of SHE1 from a back portion of SHE2.

The MP leading side 14b1 is typically tapered but in other embodiments (not shown), one or both of the MP leading side and trailing side 14t1 are orthogonal to the ABS, and coplanar with MP bottom surface 14b2 and MP top surface 14t2, respectively. Write gap field $H_{wG}$ is shown across SHE1 and SHE2 in a direction from the MP 14 to TS 17. A local MP field 14m proximate to MP trailing side 14t1, and a local TS field 17m proximate to the TS bottom surface are pointing substantially in the same direction as $H_{WS}$. In alternative embodiments where the write field 70 and return field 70b are opposite to what is shown in FIG. 7B, $H_{WS}$ is from the TS to the MP.

The benefits of SHE1 19n and SHE2 19p according to the present disclosure are realized when an applied current $I_a$ of sufficient current density flows from direct current (dc) source 50 through lead 57 to SHE1 and across conductor layer 20 to SHE2 before returning through lead 58 to the dc source. In the exemplary embodiment, backside 19e1 of SHE1 and backside 19e2 of SHE2 are at a greater height from the ABS 30-30 than height h of TS backside 17e. In other embodiments (not shown), SHE1 and SHE2 backsides may be less than h from the ABS.

Figure 7C:
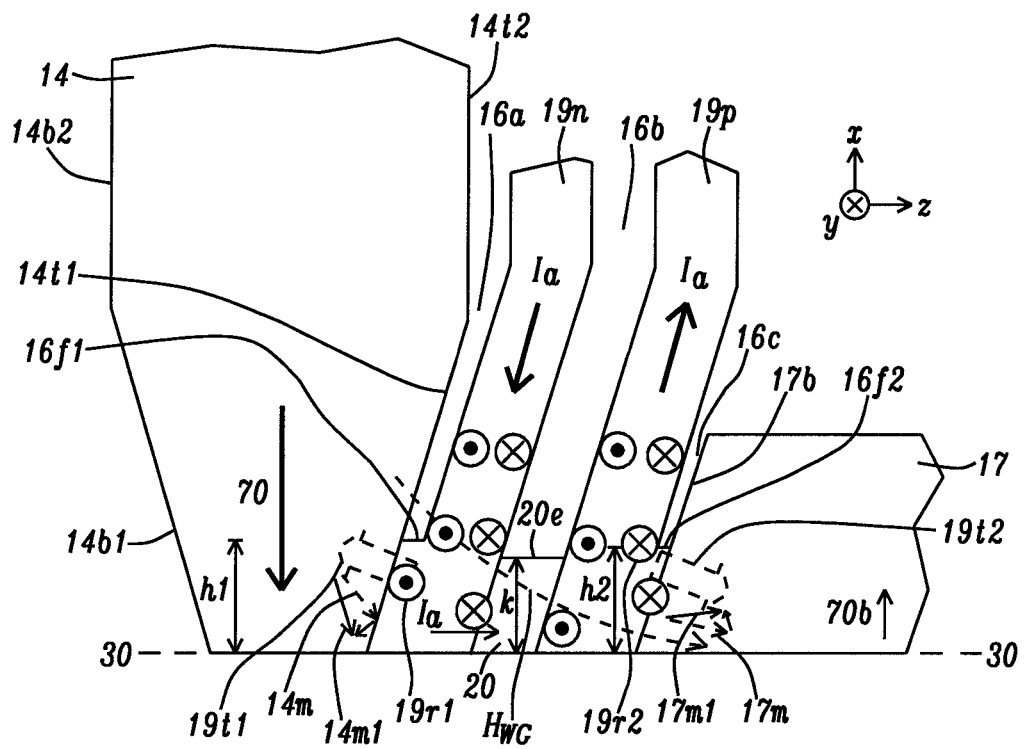

In FIG. 7C, a down-track cross-sectional view of the PMR writer in FIG. 7B is enlarged to illustrate the direction of spin polarized current in SHE1 19n and SHE2 19p. An important feature is that the direction of $I_a$ is from SHE1 across conductor layer 20 to SHE2. Front side 16f1 of a lower portion of the WG layer 16a between SHE1 and MP trailing side 14t1 is recessed to height h1 from the ABS. Similarly, front side 16f2 of WG layer 16c between SHE2 and TS bottom surface 17b is recessed to height h2 where both of h1 and h2 are from 10 nm to 70 nm. In the exemplary embodiment, the conductor layer backside 20e is at height k where k is from 5 nm to 40 nm and preferably k<h1 and h2. As a result of $I_a$, the direction of spin polarized electrons 19r1 in SHE1 proximate to MP trailing side 14t1 is out of the plane of the paper and is responsible for generating transverse spin transfer torque 19t1 that is substantially orthogonal to MP trailing side 14t1 and pointing toward the MP. The transverse spin transfer torque 19t1 causes local MP magnetization 14m to tilt and become MP magnetization 14m1 that is oriented more towards the ABS (and more parallel to write field 70). A benefit over the prior art is that spin polarized electrons in SHE1 generate a positive SHE assist (spin torque 19t1) along the entire MP/SHE1 interface. Accordingly, the write field 70 is enhanced and a lower write current is required to switch a bit magnetization 9m described earlier, which improves reliability.

Meanwhile, the direction of spin polarized electrons 19r2 in SHE2 19p proximate to TS bottom surface 17b is into the plane of the paper as a result of $I_a$, and is responsible for generating transverse spin transfer torque 19t2 that is substantially orthogonal to TS bottom surface 17b and pointing toward TS 17. The transverse spin transfer torque 19t2 causes local TS magnetization 17m to tilt and become TS magnetization 17m1 that is oriented more upward and more parallel to return field 70b. The spin polarized electrons in SHE2 generate a positive SHE assist (spin torque 19t2) along the entire SHE2/TS interface and is a significant advantage over the prior art in terms of uniformity of the SHE assist.

The mechanism for each SHE assist is similar to that described earlier with regard to FIG. 1. Conduction electrons in $I_a$ that carry spin downward in SHE1 propagate to the MP trailing side 14t1, and conduction electrons in $I_a$ with upward spin in SHE2 propagate to the TS bottom surface 17b. The spin angular momentum of the downward spin current interacts with the local MP magnetization 14m as depicted by transverse spin transfer torque 19t1. Meanwhile, spin angular momentum of the upward spin current interacts with local TS magnetization 17m as shown by transverse spin transfer torque 19t2. Another advantage is that the SHE1 and SHE2 rise time of around 1 picosecond to tens of picoseconds is substantially shorter than the writer's rise time. Therefore, the PMR writer transition speed will be significantly improved with the aforementioned SHE assists as described with respect to FIG. 17 in a later section. The write pattern's transition sharpness and overwrite will also be improved.

Figure 7D:
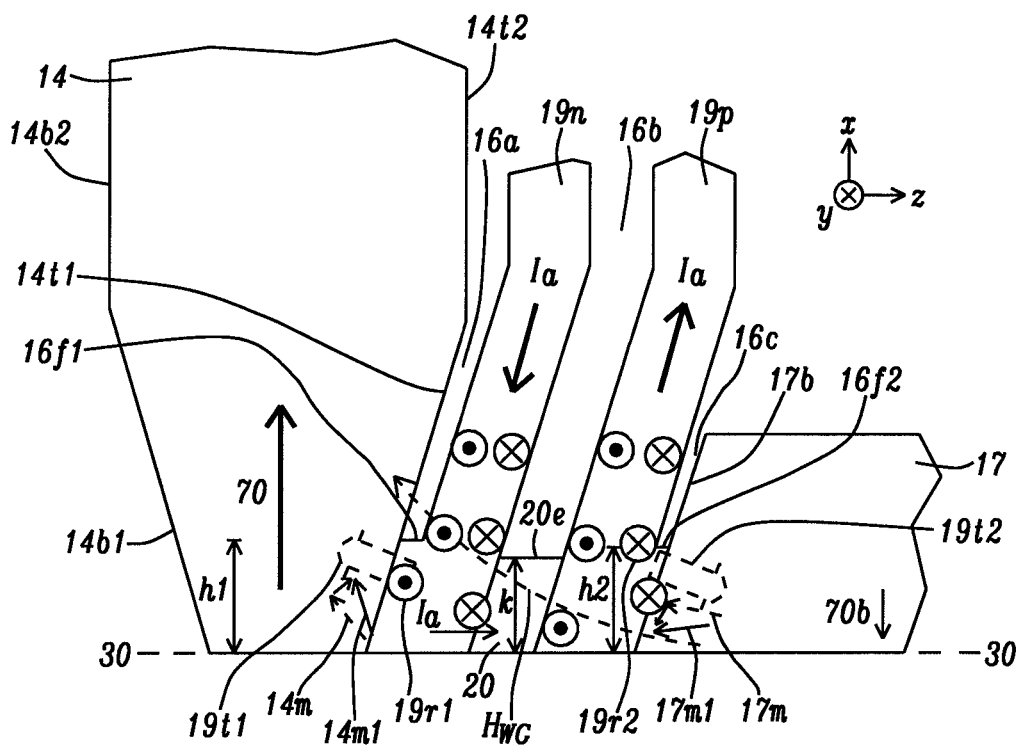

Referring to FIG. 7D, when a transition is being written where the write field 70 is pointing upward in order to switch a bit magnetization pointing down (not shown), the direction of $I_a$ remains the same as in FIG. 7C. In other words, regardless of write current polarity that determines the MP write field direction, $I_a$ remains in a constant direction from SHE1 19n and across conductor layer 20 to SHE2 19p. In this case, spin polarized electrons 19r1 in SHE1 generate transverse spin transfer torque 19t1 causes local MP magnetization 14m to tilt and become MP magnetization 14m1 that is oriented more upward (and more parallel to write field 70), and there is a substantially uniform positive SHE assist along the entire MP/SHE1 interface at the MP trailing side 14t1. Thus, the same benefits are realized as in the FIG. 7C embodiment. Furthermore, spin polarized electrons 19r2 in SHE2 generate transverse spin transfer torque 19t2 that causes local TS magnetization 17m to tilt and become TS magnetization 17m1 that is oriented more downward (and more parallel to return field 70b), and there is a substantially uniform SHE assist along the entire SHE2/TS interface at TS bottom surface 17b.

The local moments of MP 14 and TS 17 that receive the transverse spin torque interactions follow the Landau-Lifshitz-Gilbert (LLG) equation (shown below) that relates to the transverse spin torque generated with spin polarized electrons in each of SHE1 19n and SHE2 19p, respectively.

$$\frac{d\hat{m}}{dt} = -\gamma\hat{m}\times\overrightarrow{B_{\textit{eff}}} + \alpha\hat{m}\times\frac{d\hat{m}}{dt} - \gamma\frac{hJ_S}{4\pi eM_S t}(\hat{m}\times\hat{m}\times\hat{\sigma})$$

$$= -\gamma\hat{m}\times\left(\overrightarrow{B_{\textit{eff}}} + \frac{hJ_S}{4\pi eM_S t}\hat{m}\times\hat{\sigma}\right) + \alpha\hat{m}\times\frac{d\hat{m}}{dt}$$

In the equation above, $\hat{m}$ is the unit vector of the local magnetic moment, $\hat{\sigma}$ is the unit vector of the injected spin polarization, $\gamma$ is the gyromagnetic ratio, $\alpha$ is the damping parameter, and t is the effective depth by which the spin transfer torque occurs in the MP and TS, typically several atomic layers. After the first equality sign "=", the first term is the precession along the total magnetic field vector $B_{\textit{eff}}$, and the second is the damping term. The last term is the spin torque term which can be merged to the first term so that $$\frac{hJ_S}{4\pi eM_S t}\hat{m}\times\hat{\sigma}$$

functions like the additional effective field to tilt local MP magnetization 14m to 14m1 and to tilt local TS magnetization 17m to 17m1, which work together with the magnetic fields 70, 70b, respectively. Js is the spin current density, and Ms is the magnetization density of the MP and TS where the spin current is injected. A MP layer (not shown) adjoining MP trailing side 14t1 and a TS layer (not shown) adjoining the TS bottom surface 17b each have a magnetization that is rotated by the additional effective field. The rotation is then propagated to the effective depth mentioned above through magnetic exchange interactions.

Unlike a current threshold requirement for assist effects to occur with SOT-MRAM or STT-MRAM, there is no current threshold for $I_a$ to begin a SHE assist in the SHAMR embodiments of the present disclosure. This advantage is related to the fact that injected spin current from SHE1 19n to MP 14 and from SHE2 19p to TS 17 always carries spin direction parallel to the MP/SHE1 and SHE2/TS interfaces and is substantially orthogonal to the local MP magnetization 14m and local TS magnetization 17m, respectively. The magnitude of transverse spin transfer torque 19t1 and 19t2 increases as $I_a$ current density is increased. A maximum SHE assist from SHE1 occurs when local MP magnetization 14m1 is parallel to MP trailing side 14t1, and a maximum SHE assist from SHE2 occurs when local TS magnetization 17m1 is parallel to TS bottom surface 17b. There is no risk of an over-push situation where local MP and local TS magnetizations are tilted beyond a position that is parallel to the MP trailing side and to the TS bottom surface, respectively.

Figure 8A:
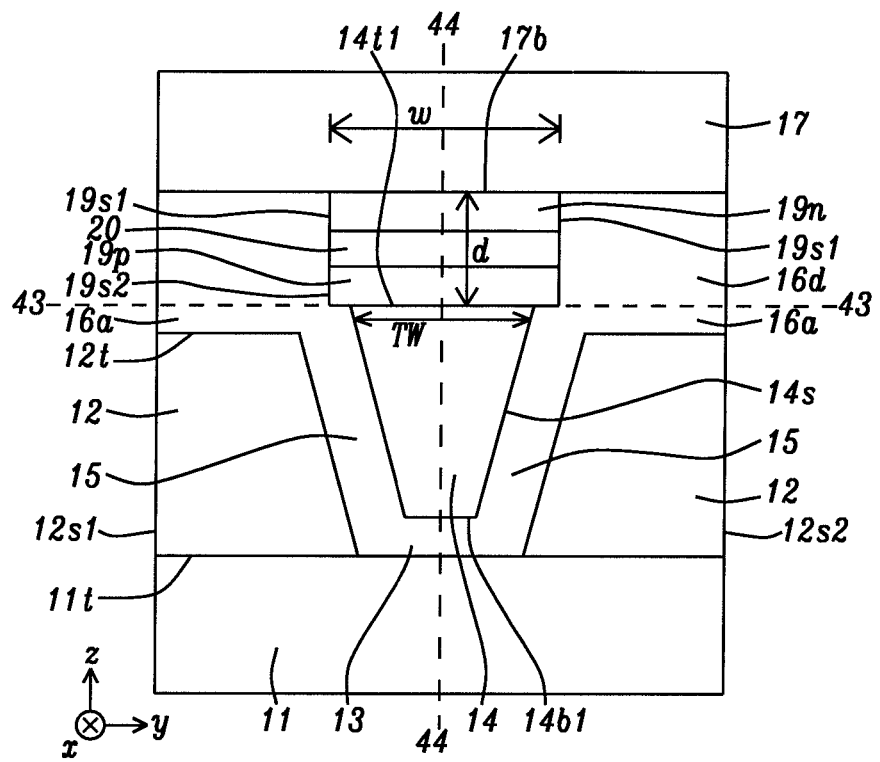
FIG. 8A is an ABS view.
Figure 8B:
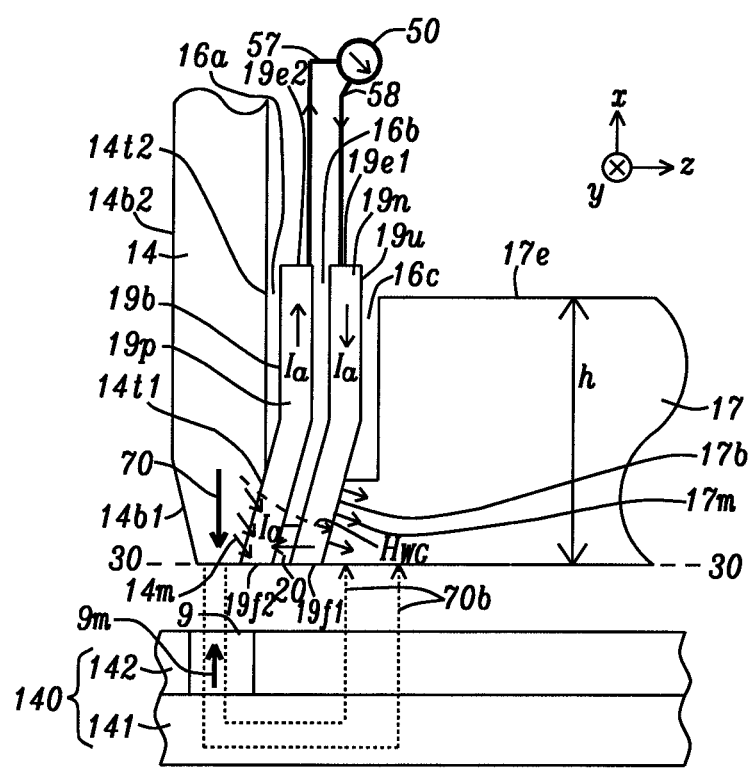
FIGS. 8B-8D are down-track cross-sectional views where current Ia flows from SHE1, which adjoins a TS, across a conductor to SHE2 that contacts a MP trailing side to enhance a write field and a return field according to a second embodiment of the present disclosure.

Referring to FIGS. 8A-8B, the present disclosure also encompasses an embodiment where the positions of SHE1 19n and SHE2 19p are switched with respect to the first embodiment. All other features of the first embodiment shown in FIGS. 7A-7B are retained in FIGS. 8A-8B.

With regard to FIG. 8B, the same advantageous results of enhanced write field 70 and better TS return field 70b associated with the previous embodiment are achieved when a front portion of SHE1 top surface 19u contacts the TS bottom surface 17b, and a front portion of SHE2 bottom surface 19b adjoins the MP trailing side 14t1, and current Ia flows from SHE1 across the conductor layer 20 to SHE2. When MP write field 70 is downward, $I_a$ flows from direct current source 50 through lead 58 to SHE1 19n and then across the conductor layer to SHE2 19p before returning to the dc source through lead 57.

Figure 8C:
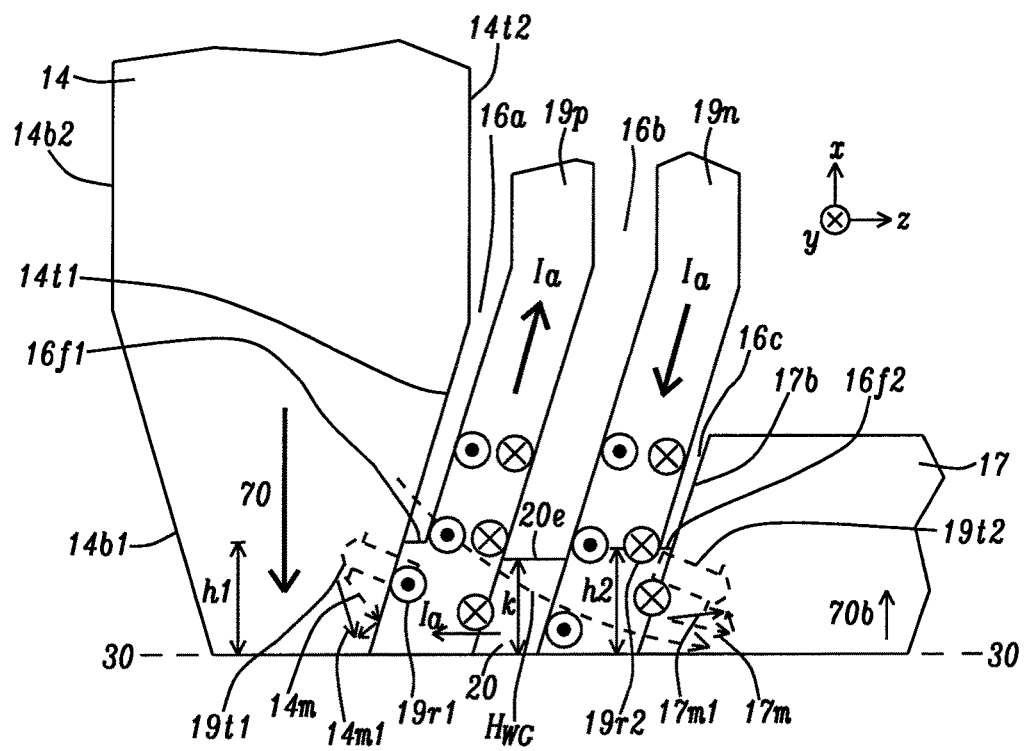

In FIG. 8C, a down-track cross-sectional view of the PMR writer in FIG. 8B is enlarged to illustrate the direction of spin polarized current in SHE1 19n and SHE2 19p. In this case, the direction of spin polarized electrons 19r2 in SHE1 proximate to TS bottom surface 17b is into the plane of the paper and is responsible for generating transverse spin transfer torque 19t2 that is substantially orthogonal to the TS bottom surface, and causes local TS magnetization 17m to tilt and become TS magnetization 17m1 that is oriented upward and enhances the return field 70b. A benefit over the prior art is that spin polarized electrons in SHE1 generate a positive SHE assist (spin torque 19t2) along the entire SHE1/TS interface.

The direction of spin polarized electrons 19r1 in SHE2 19p proximate to MP trailing side 14t1 is out of the plane of the paper as a result of $I_a$, and is responsible for generating transverse spin transfer torque 19t1 that is substantially orthogonal to the MP trailing side, and causes local MP magnetization 14m to tilt and become MP magnetization 14m1 that is oriented more downward and enhances write field 70. The spin polarized electrons in SHE2 generate a positive SHE assist (spin torque 19t1) along the entire MP/SHE2 interface and is a significant advantage over the prior art in terms of uniformity of the SHE assist.

Figure 8D:
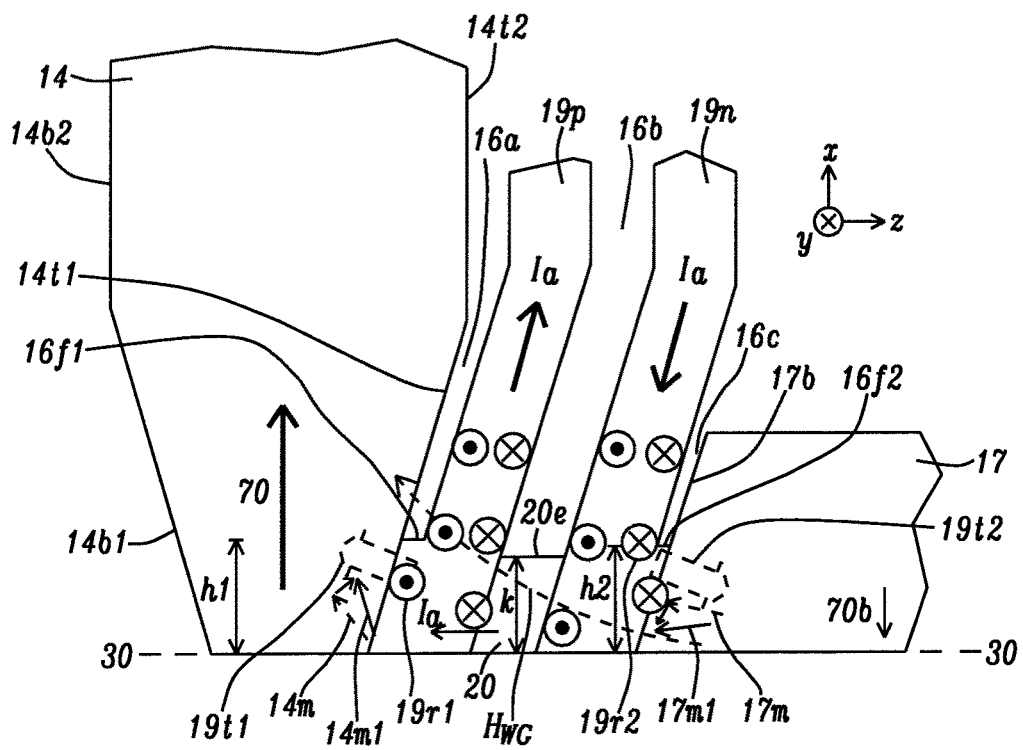

Referring to FIG. 8D, when a transition is being written where the write field 70 is pointing upward in order to switch a bit magnetization pointing down (not shown), the direction of $I_a$ remains the same as in FIG. 8C. Here, spin polarized electrons 19r2 in SHE1 generate transverse spin transfer torque 19t2 causes local TS magnetization 17m to tilt and become TS magnetization 17m1 that is oriented more downward to enhance return field 70b, and there is a substantially uniform positive SHE assist along the entire SHE1/TS interface. Spin polarized electrons 19r1 in SHE2 generate transverse spin transfer torque 19t1 that causes local MP magnetization 14m to tilt and become MP magnetization 14m1 that is oriented more upward to enhance write field 70, and there is a substantially uniform SHE assist along the entire MP/SHE2 interface. Meanwhile, all benefits including better overwrite, lower BER, improved reliability, no threshold requirement for a SHE assist, and better transition speed that are associated with the first embodiment are retained. Moreover, since Ia current density is minimized, and Ia is not confined to SHE1 or SHE2, heating is controlled and SHE layer protrusion at the ABS 30-30 is avoided similar to the prior art in related patent application Ser. No. 16/563, 147.

Figure 9:
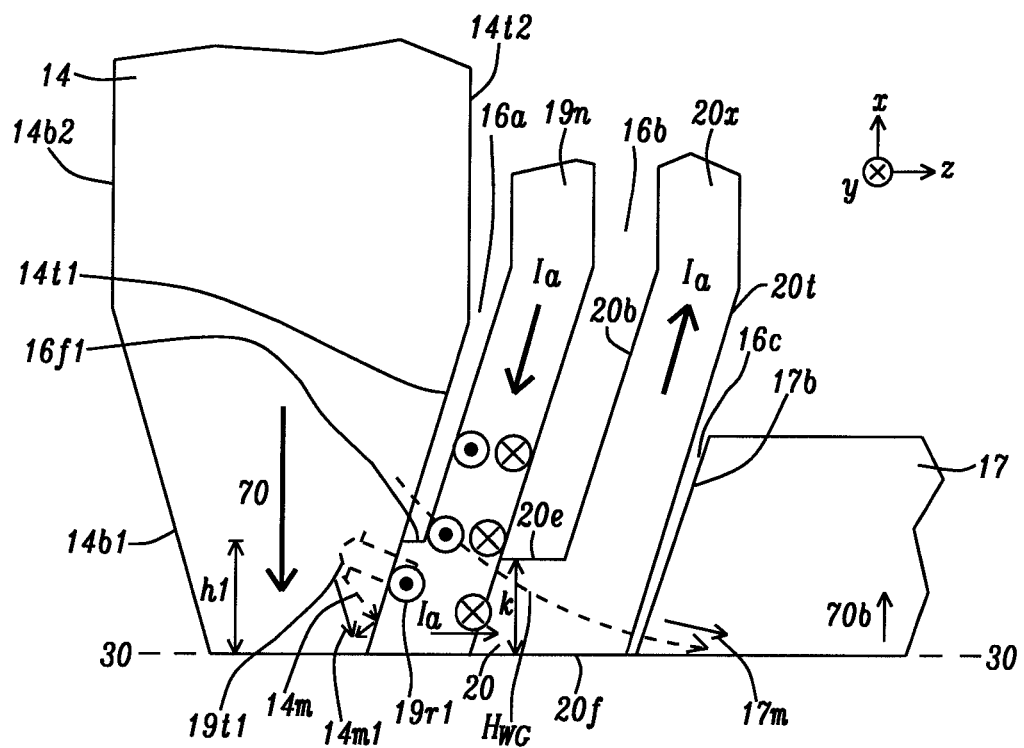
FIG. 9 is a down-track cross-sectional view where the conductor in the first embodiment is extended away from the ABS and replaces SHE2 so that current Ia flows from a dc source to SHE1 and then back to the dc source through the conductor according to a third embodiment of the present disclosure.

According to a third embodiment shown in FIG. 9, SHE2 in the first embodiment is replaced with an extension 20x on conductor layer 20 from front side 20f to a backside (not shown) at a height >h. Thus, current Ia flows from SHE1 19n to the conductor layer and then back through the conductor extension and through lead 58 to dc source 50 shown previously in FIG. 7B. In FIG. 9, top surface 20t of the conductor and conductor extension is separated from TS 17 by WG layer 16c. As a result, no spin polarized current is injected into the TS and there is no assist to TS magnetization 17m. However, transverse spin transfer torque 19t1 is generated by spin polarized electrons 19r1 in SHE1 19n proximate to MP trailing side 14t1, and provides a SHE assist to enhance write field 70. Therefore, all of the benefits derived from SHE1 in the first embodiment are retained in the third embodiment.

Figure 10:
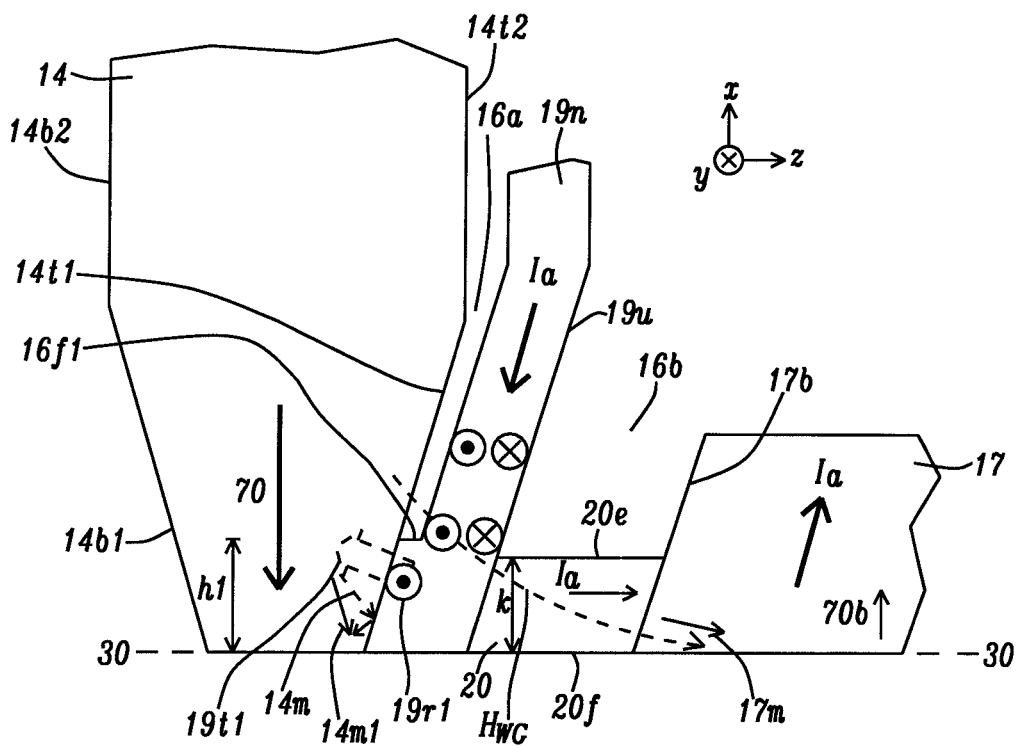
FIG. 10 is a modification of the third embodiment where the conductor has a top surface contacting the TS so that current Ia from the dc source flows from SHE1 and across the conductor to the TS, and then back to the dc source through a lead according to a fourth embodiment of the present disclosure.

In a fourth embodiment depicted in FIG. 10, the first embodiment is modified with the removal of SHE2 and extending conductor layer 20 to TS bottom surface 17b. Accordingly, the conductor layer has backside 20e with a uniform height k. The direction of $I_a$ is from SHE1 across the conductor layer to TS 17 and then returns to the dc source through a lead (not shown). Similar to the third embodiment, there is no spin current injected into the TS, but SHE1 19n continues to apply a positive SHE assist to boost write field 70 as a result of generating spin transfer torque 19t1 that tilts MP magnetization 14m to become local MP magnetization 14m1, that is more parallel to the write field. The fourth embodiment is more process friendly (fewer fabrication steps) than the third embodiment because there is no need for WG layer 16c and the conductor extension.

Figure 11:
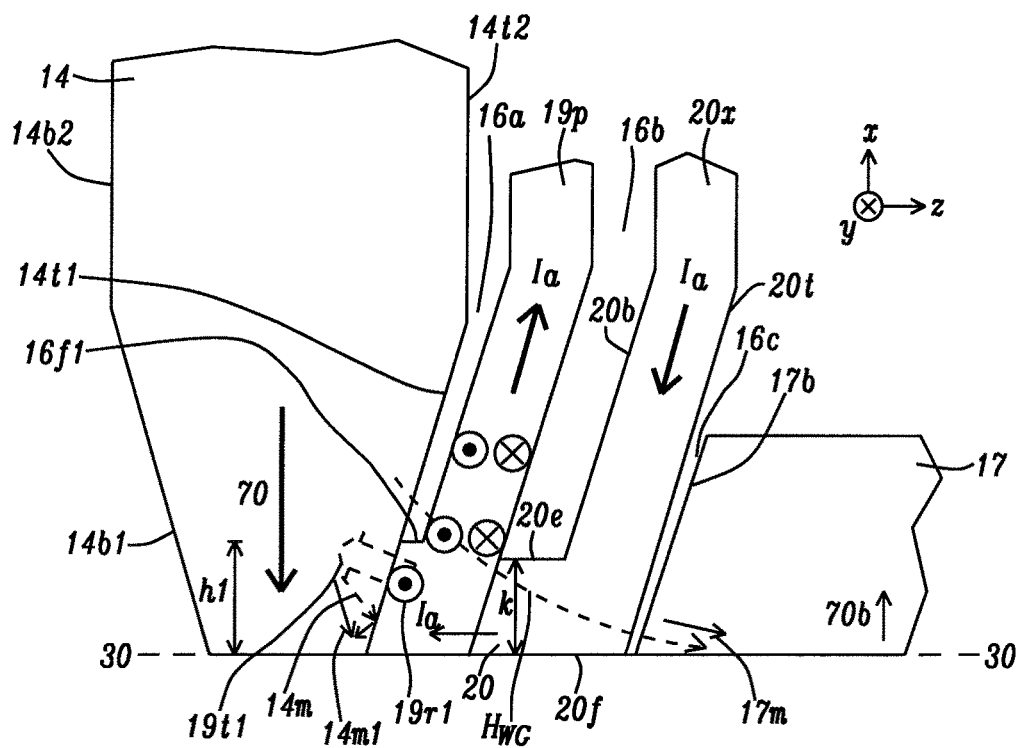
FIG. 11 is a down-track cross-sectional view where the conductor in the second embodiment is extended away from the ABS and replaces SHE1 so that current Ia flows from a dc source to the conductor and then back to the dc source through SHE2 according to a fifth embodiment of the present disclosure.

According to a fifth embodiment of the present disclosure shown in FIG. 11, SHE1 in the second embodiment is replaced with an extension 20x on conductor layer 20 from front side 20f to a backside (not shown) at a height >h. Thus, current Ia flows through the conductor extension and conductor layer to SHE2 19p before returning through lead 57 to dc source 50. In FIG. 11, top surface 20t of the conductor and conductor extension is separated from TS 17 by WG layer 16c. As a result, spin polarized current is not injected into the TS and there is no assist to TS magnetization 17m.

However, transverse spin transfer torque 19t1 is generated by spin polarized electrons 19r1 in SHE2 19p proximate to MP trailing side 14t1, and provides a SHE assist to enhance write field 70. As a result, all of the benefits derived from SHE2 in the second embodiment are retained in the fifth embodiment.

Figure 12:
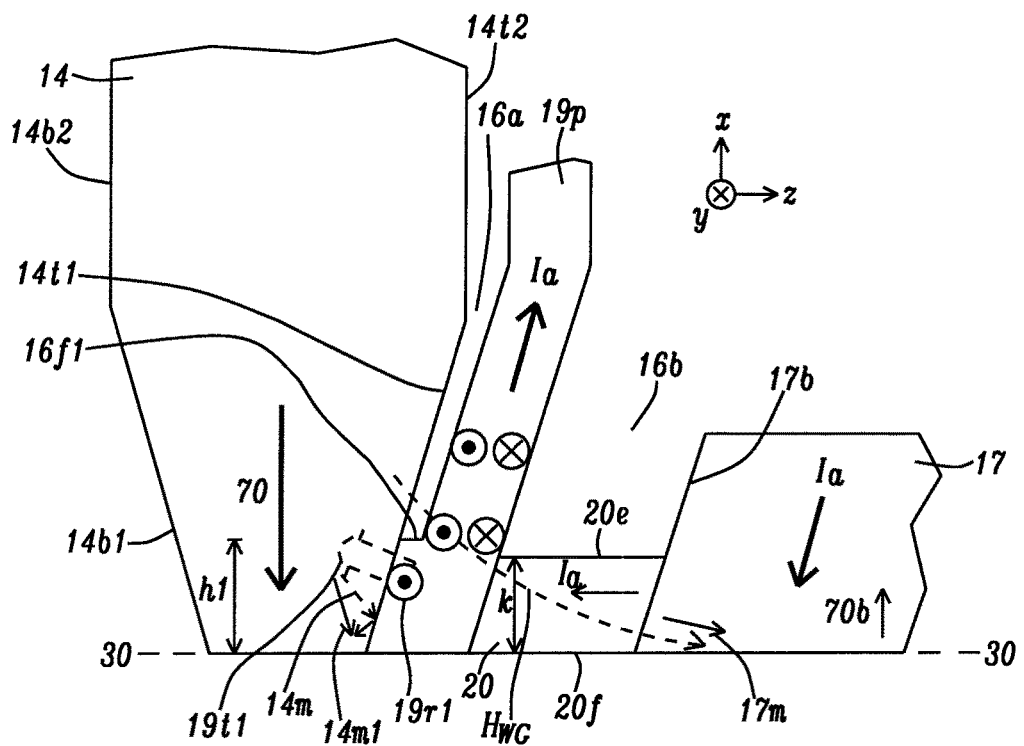
FIG. 12 is a modification of the fifth embodiment where the conductor has a top surface contacting the TS and where current Ia from the dc source flows from the TS and across the conductor to SHE2, and then back to the dc source through a lead according to a sixth embodiment of the present disclosure.

Referring to FIG. 12, a sixth embodiment of the present disclosure is depicted and is a modification of the second embodiment in that SHE1 is removed and conductor layer 20 is extended to the TS bottom surface 17b, and has backside 20e with a uniform height k. The direction of $I_a$ is from TS 17 and across the conductor layer to SHE2, and then $I_a$ returns through a lead 57 to dc source 50. As in the fifth embodiment, there is no spin current injected into the TS, but SHE2 19p applies a positive SHE assist to boost write field 70 as a result of generating spin transfer torque 19t1 that tilts MP magnetization 14m to become local MP magnetization 14m1, that is more parallel to the write field. The sixth embodiment is more process friendly than the fifth embodiment since forming the conductor layer and WG layer 16b requires fewer process steps than fabricating two WG layers 16b, 16c, the conductor extension 20x, and conductor layer in FIG. 11.

Figure 13:
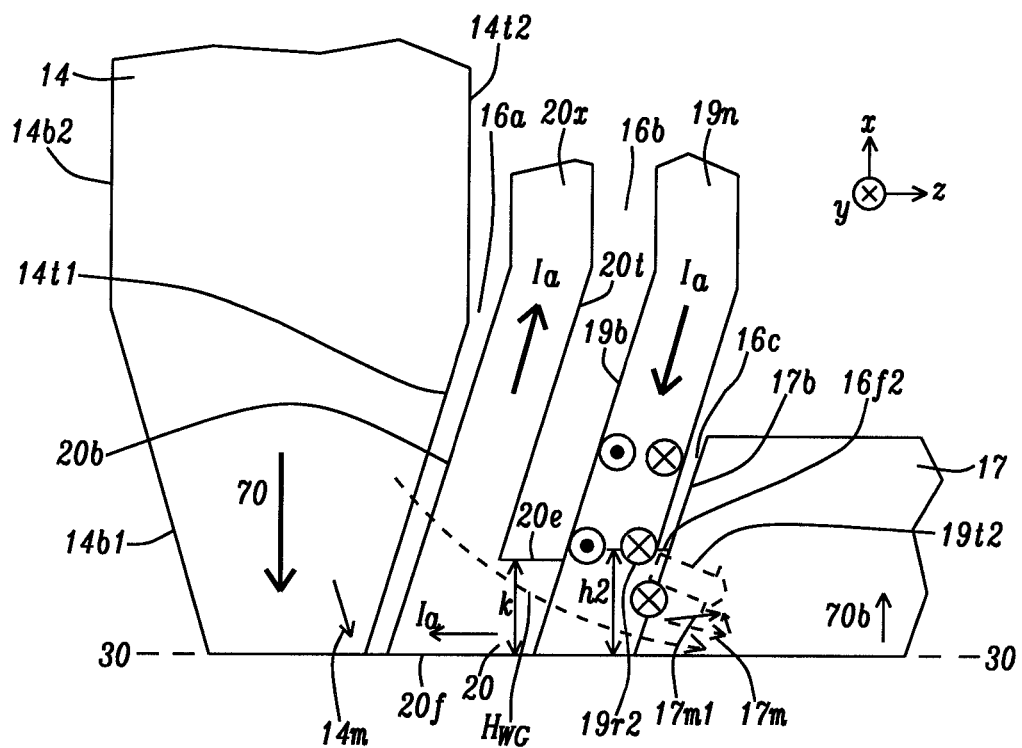
FIG. 13 is a down-track cross-sectional view where the conductor in the second embodiment is extended away from the ABS and replaces SHE2 so that current Ia flows from a dc source to SHE1 and then back to the dc source through the conductor according to a seventh embodiment of the present disclosure.

In the seventh embodiment shown in FIG. 13, SHE2 in the second embodiment is replaced with an extension 20x on conductor layer 20 from front side 20f to a backside (not shown) at a height >h. Current Ia flows from SHE1 19n to the conductor layer and then back through the conductor extension and through a lead to the dc source (not shown). Bottom surface 20b of the conductor and conductor extension is separated from MP 14 by WG layer 16a. As a result, no spin polarized current is injected into the MP and there is no assist to MP magnetization 14m. However, transverse spin transfer torque 19t2 is generated by spin polarized electrons 19r2 in SHE1 19n proximate to TS bottom surface 17b, and provides a SHE assist to enhance return field 70b. Accordingly, all of the benefits derived from SHE1 in the second embodiment are retained in the seventh embodiment.

Figure 14:
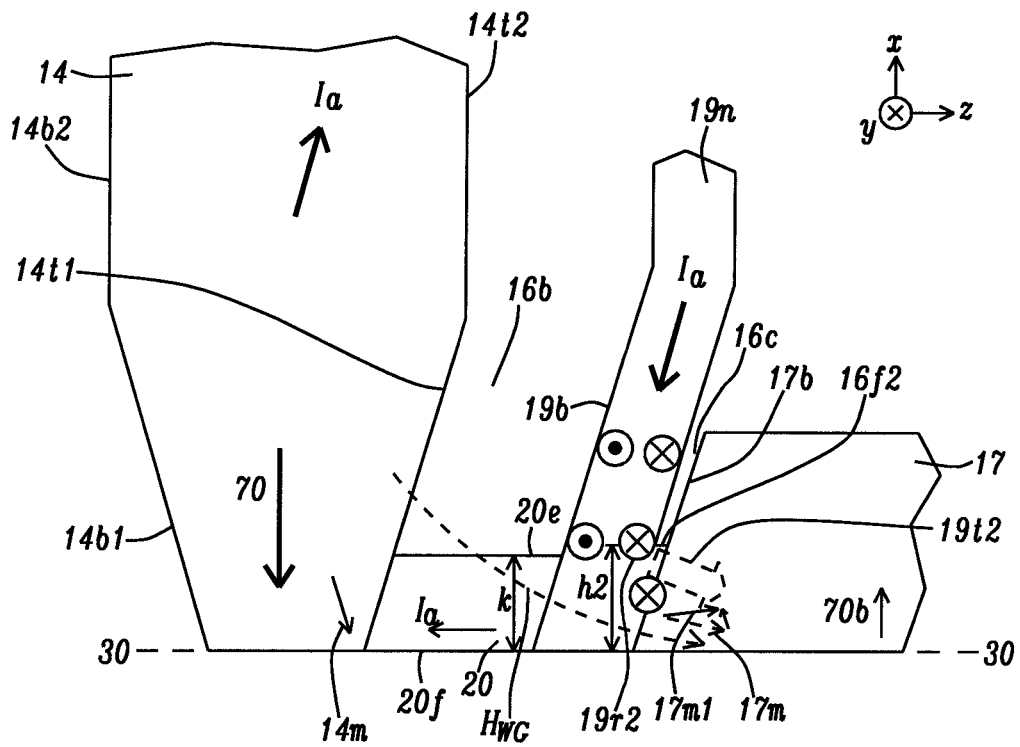
FIG. 14 is a modification of the seventh embodiment where the conductor has a bottom surface contacting the MP and where current Ia from the dc source flows from SHE1 and across the conductor to the MP, and then back to the dc source through a lead according to an eighth embodiment of the present disclosure.

There is an eighth embodiment shown in FIG. 14 wherein the second embodiment is modified with the removal of SHE2 and extending conductor layer 20 to MP trailing side 14t1. The conductor layer has backside 20e with a uniform height k. The direction of $I_a$ is from SHE1 across the conductor layer to MP 14 and then returns to the dc source through a lead (not shown) from the MP. As in the seventh embodiment, there is no spin current injected into the MP, but SHE1 19n continues to apply a positive SHE assist to boost return field 70b as a result of generating spin transfer torque 19t2 that tilts TS magnetization 17m to become local TS magnetization 17m1, that is more parallel to the return field. The eighth embodiment is more process friendly than the seventh embodiment since there is no need for WG layer 16a and the conductor extension.

Figure 15:
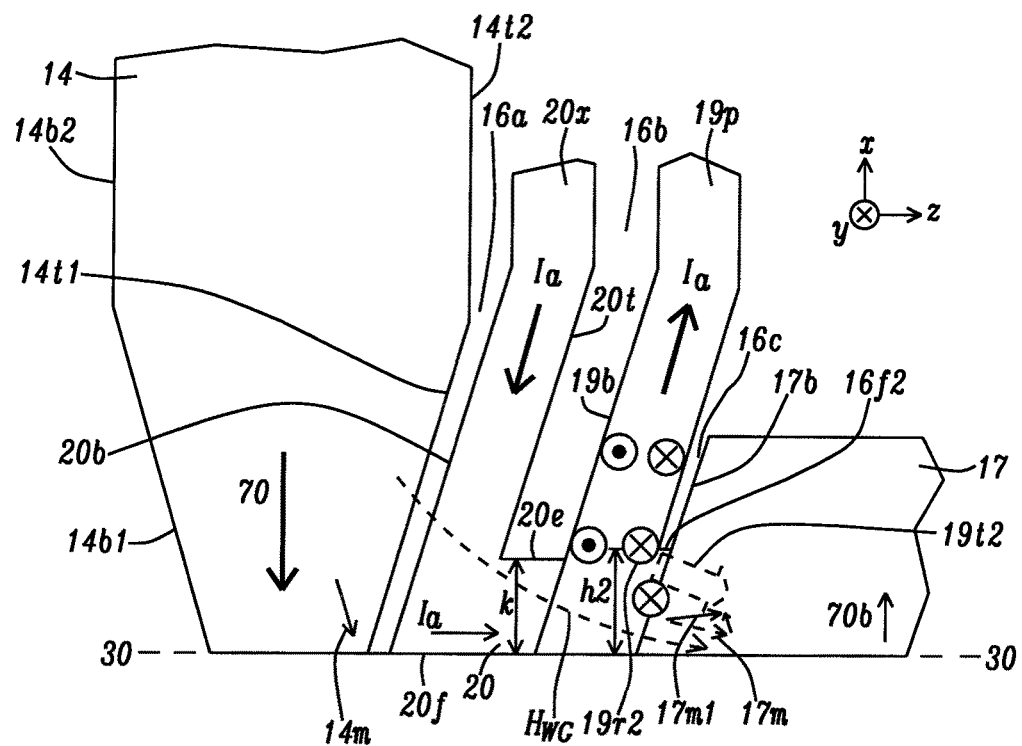
FIG. 15 is a down-track cross-sectional view where the conductor in the first embodiment is extended away from the ABS and replaces SHE1 so that current Ia flows from a dc source through the conductor to SHE2 and then back to the dc source according to a ninth embodiment of the present disclosure.

According to a ninth embodiment of the present disclosure shown in FIG. 15, SHE1 in the first embodiment is replaced with an extension 20x on conductor layer 20 from front side 20f to a backside (not shown) at a height >h. Current Ia flows from a dc source and through a lead (not shown) to the conductor extension and then across the conductor layer to SHE2 19p before returning through lead 58 to dc source 50 similar to FIG. 7B. Bottom surface 20b of the conductor and conductor extension is separated from MP 14 by WG layer 16a. Therefore, no spin polarized current is injected into the MP and there is no assist to MP magnetization 14m. However, transverse spin transfer torque 19t2 is generated by spin polarized electrons 19r2 in SHE2 proximate to TS bottom surface 17b, and provides a SHE assist to enhance return field 70b. As a result, all of the benefits derived from SHE2 in the first embodiment are retained in the ninth embodiment.

Figure 16:
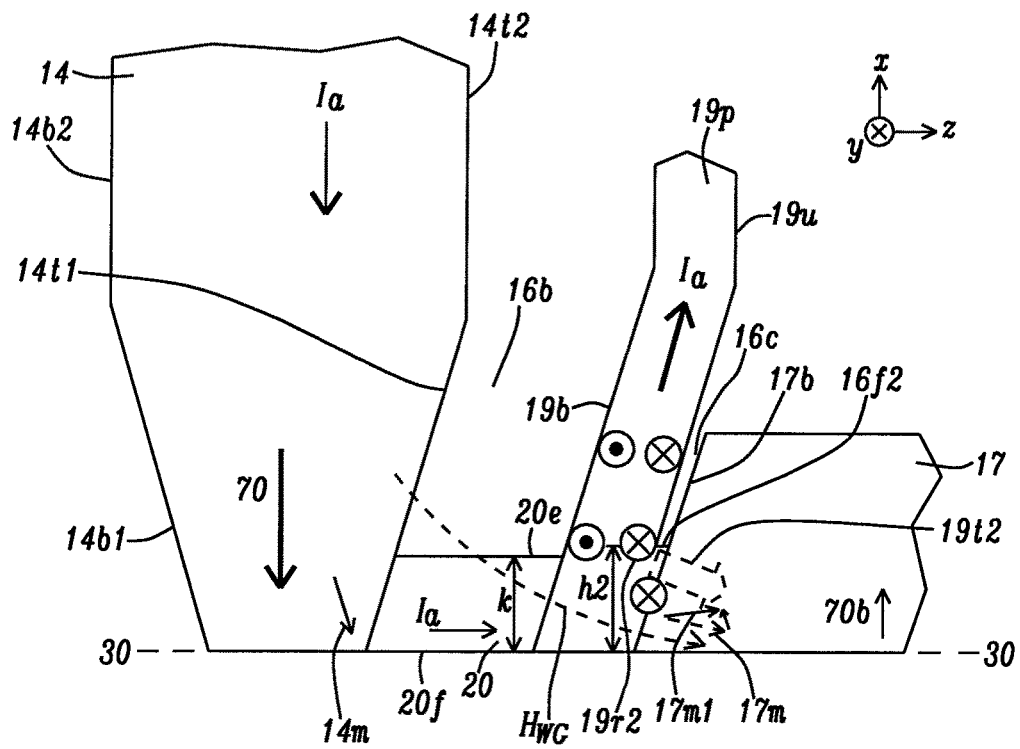
FIG. 16 is a modification of the ninth embodiment where the conductor has a bottom surface contacting the MP so that current Ia from the dc source flows from the MP and across the conductor to SHE2, and then back to the dc source through a lead according to a tenth embodiment of the present disclosure.

A tenth embodiment is depicted in FIG. 16 wherein the first embodiment is modified with the removal of SHE1 so that the conductor layer 20 is extended to MP trailing side 14t1, and has backside 20e with a uniform height k. In this case, $I_a$ flows from MP 14 and across the conductor layer to SHE2 19p, and then returns to dc source 50 through lead 58. Although there is no spin current injected into the MP, SHE2 19p continues to apply a positive SHE assist to boost return field 70b as a result of generating spin transfer torque 19t2 that tilts TS magnetization 17m to become local TS magnetization 17m1, that is more parallel to the return field. Note that the tenth embodiment is more process friendly than the ninth embodiment since there is no need for WG layer 16a and the conductor extension.

Figure 17:
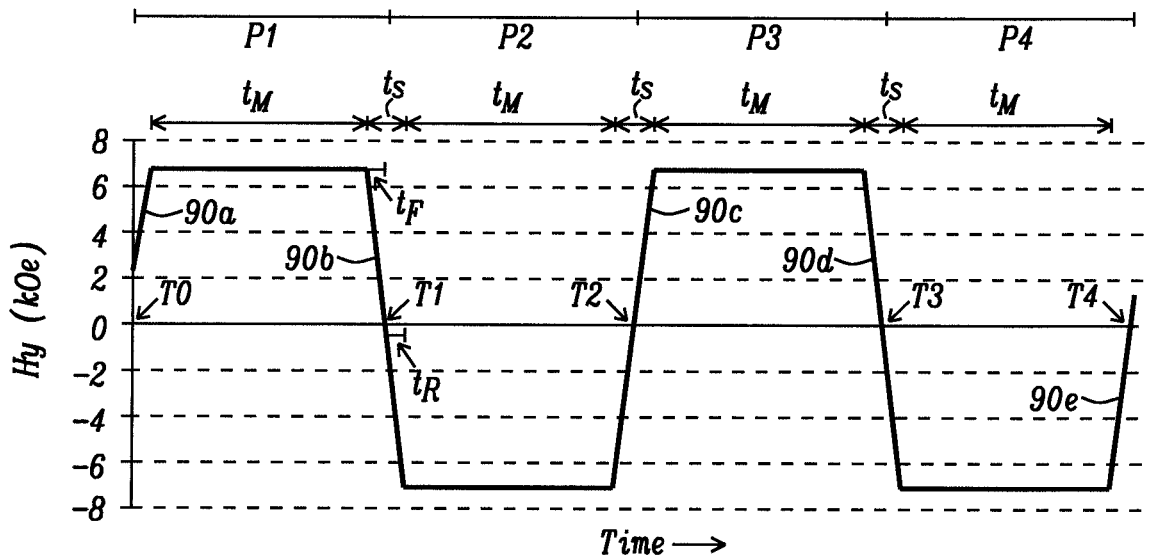
FIG. 17 shows switching time including fall time and rise time during the transition from writing one bit to the next bit.

In all embodiments, each of WG layers 16a-16c is preferably a single layer or multilayer including but not limited to AlOx, SiOx, MgO, AlNx, TiOx, and other insulating oxides, oxynitrides, or nitrides used in the art. Moreover, the constant direct current in SHE1 19n and SHE2 19p is around 1-6 mA zero-to-peak amplitude (AMP). Ideally, the write current ($I_w$) waveform used to generate write field 70 is a step transition at each of transition T0-T4 between write periods P1-P4 (FIG. 17) in the absence of a SHAMR assist involving SHE technology described in the embodiments of the present disclosure. However, as shown in FIG. 17, during a typical Iw (+) to (−) polarity transition or during a (−) to (+) polarity transition, the writer has a finite fall time ($t_F$) and finite rise time ($t_R$) between periods ($t_M$) where a maximum (absolute) Hy field is realized and the MP write field is orthogonal to the ABS (not shown). As a result, each switching period is represented in the Iw waveform by slopes 90a-90e that are non-vertical. Without a SHAMR assist, MP magnetization will follow the Iw transition, but with a finite time delay ($t_R$), usually at the sub-nanosecond time scale. After each of T0-T4, MP write field 70 as in FIG. 7B, for example, is not switched to an opposite direction from the previous write period until the end of $t_R$.

However, when there is a SHAMR assist with a giant SHA material (SHE1 and SHE2) depicted in FIGS. 7A-7B, for example, spin current is built up and is generating transverse spin torque 19t1 and 19t2 to provide a SHAMR assist within 1 to tens of picoseconds after the write current $I_w$ direction (not shown) is reversed. Accordingly, transverse spin torque works together with the $I_w$ induced field to flip the MP write field direction thereby yielding a shorter rise time ($t_R$), which means each of the slopes 90a-90e in FIG. 17 will be more vertical than when no SHAMR assist is applied. Each of the other SHAMR embodiments described herein also provides a decreased rise time.

In actual practice, there is an overshoot in $I_w$ immediately after a transition to ensure a fast rise time in a conventional PMR writer. Using a SHAMR assist according to an embodiment of the present disclosure, an overshoot in current through SHE1 and SHE2 would increase transverse spin transfer torque as well. Faster rise time with a SHAMR assist will improve the writer's transition speed and provide better transition sharpness as an additional advantage to enhancing the MP write field, and boosting the TS return field.

A simulation was performed to demonstrate the benefits of the present disclosure according to the embodiment shown in FIG. 7A where spin polarization of current $I_a$ in SHE1 19n produces transverse spin transfer torque 19t1 that tilts local MP magnetization 14m to become local MP magnetization 14m1. The tilt is quantified by angle $\theta_1$ shown in FIG. 18D. Similarly, spin polarization of current $I_a$ in SHE2 19p produces transverse spin transfer torque 19t2 that tilts local TS magnetization 17m to become local TS magnetization 17m1 (FIG. 7A) with a resulting tilt angle $\theta_2$ shown in FIG. 18D. The parameters used for the simulation are SHA=0.2 for SHE1 and SHE2, and where each of SHE1 and SHE2 has a thickness<12 nm.

Figure 18A:
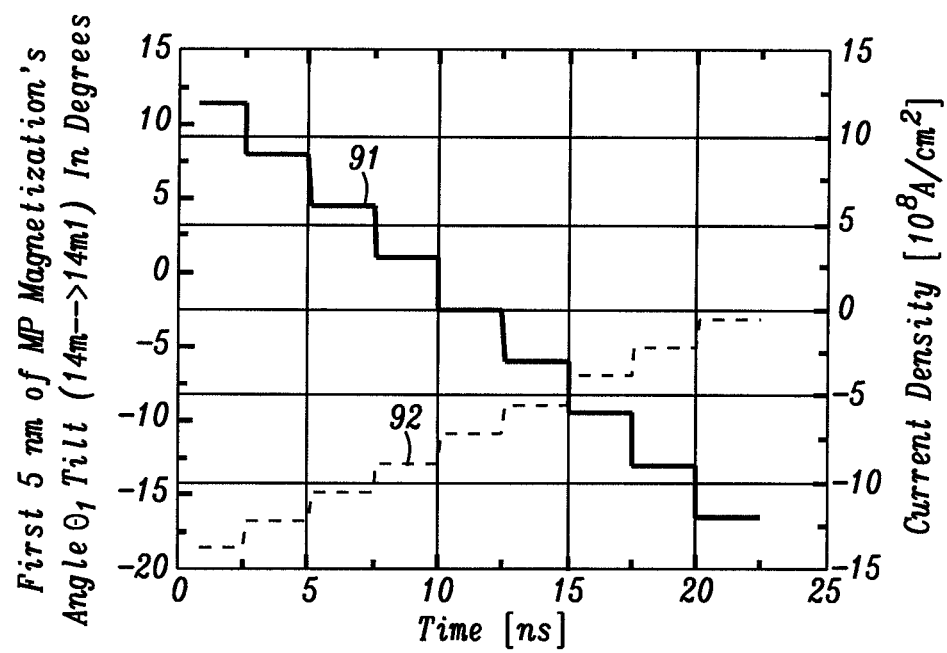
Figure 18B:
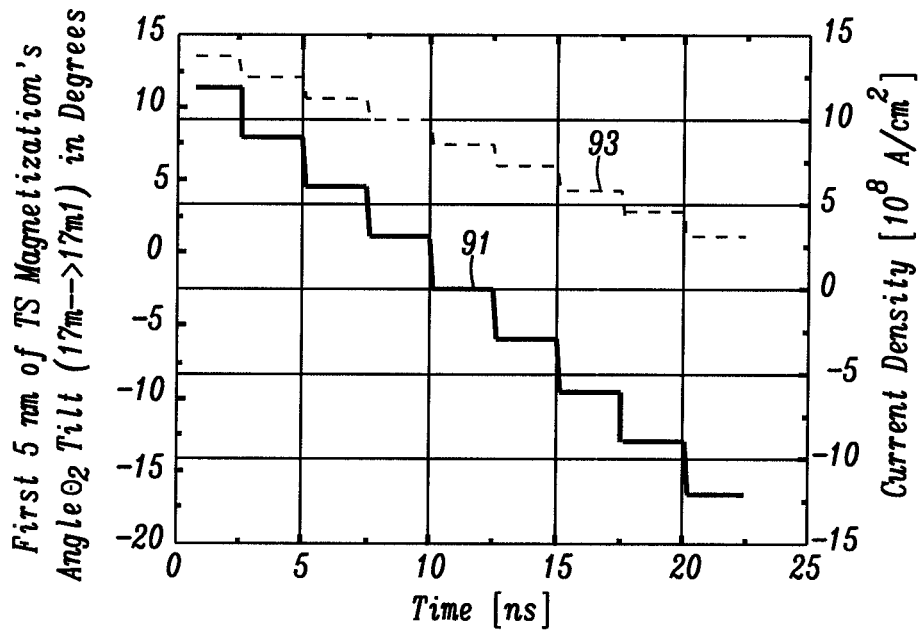

Referring to FIG. 18A and FIG. 18B, the current density for $I_a$ as shown in curve 91 was scanned from $+12\times10^8$ Amps/cm$^2$ in steps of $3\times10^8$ Amps/cm$^2$ to $-12\times10^8$ Amps/cm$^2$. A duration of 0.1 ns for a linear transition is applied between two adjacent current densities and each current density has a duration of 2.4 ns. The final statistics of magnetization rotation is applied to the first 5 nm of the MP and TS into their respective interfaces with SHE1 and SHE2, respectively. Curve 92 in FIG. 18A shows tilt angle $\theta_1$ of averaged magnetization for the first 5 nm of the MP from the ABS at the MP/SHE1 interface while curve 93 in FIG. 18B depicts tilt angle $\theta_2$ of averaged magnetization for the first 5 nm of the TS from the ABS at the SHE2/TS interface. At zero current density, the first 5 nm of the local MP magnetization is tilted by about 12 degrees from normal to the WG (perpendicular to the MP surface facing the WG) towards the out of ABS (down) direction, which means a negative value in FIG. 18A. Meanwhile, at zero current density, the local TS magnetization is tilted around 8 degrees away from the normal-to-the-WG direction towards the into the ABS direction, corresponding to a positive value in FIG. 18B.

Figure 18C:
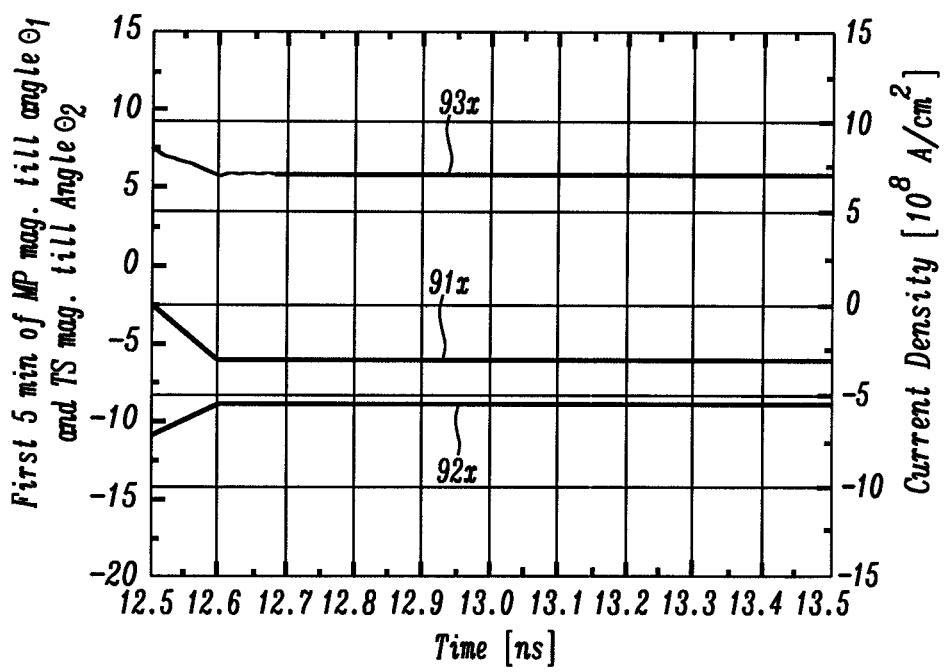
FIG. 18C is a portion of FIGS. 18A-18B at time 12.5-13.5 ns.
Figure 18D:
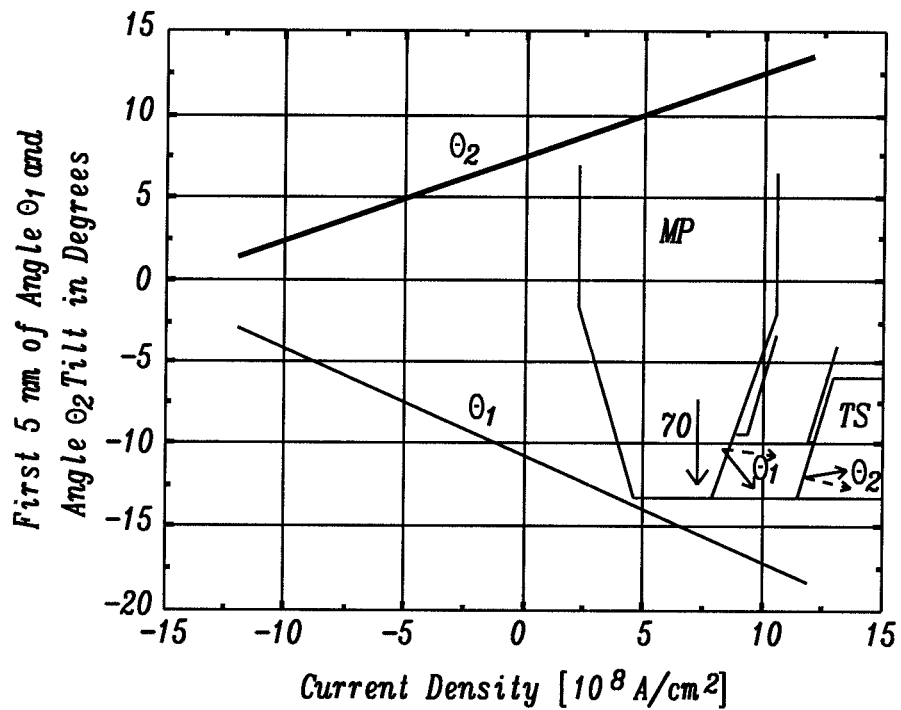
FIG. 18D shows $\theta_1$ and $\theta_2$ as a function of current density.

FIG. 18D indicates that with a change in applied current from $-12\times10^8$ Amps/cm$^2$ to $+12\times10^8$ Amps/cm$^2$, the first 5 nm of the local MP magnetization in the SHAMR structure of the present disclosure is tilted further downward with an increase in the absolute value of $\theta_1$ of 0.65 degree per $10^8$ Amps/cm$^2$ change in current density. Furthermore, the first 5 nm of local TS magnetization is tilted further towards the up direction with an increase in $\theta_2$ of 0.52 degree per $\times10^8$ Amps/cm$^2$ change in current density. These results are a quantitative estimation of the magnetic recording SHE assists mentioned previously. It is noted that the tilt angles quickly follow the current density change, and there is essentially no time delay in the angle tilt as a function of current density change. Even during the 0.1 ns transition time between each adjacent current density, the tilt angles $\theta_1$ and $\theta_2$ closely follow a linear dependence vs. current density as illustrated in FIG. 18C where a 1 ns regime is enlarged. Note that section 93x of curve 93 from FIG. 18B and section 92x of curve 92 from FIG. 18A adjust to the current density change in section 91x of time curve 91 during the same 0.1 ns interval from 12.5 to 12.6 ns. This result indicates that the SHAMR effect's rise time is substantially less than 0.1 nanosecond (ns), which is consistent with the theoretical estimation of 1 picosecond (ps) to a plurality of ps.

Figure 19A:
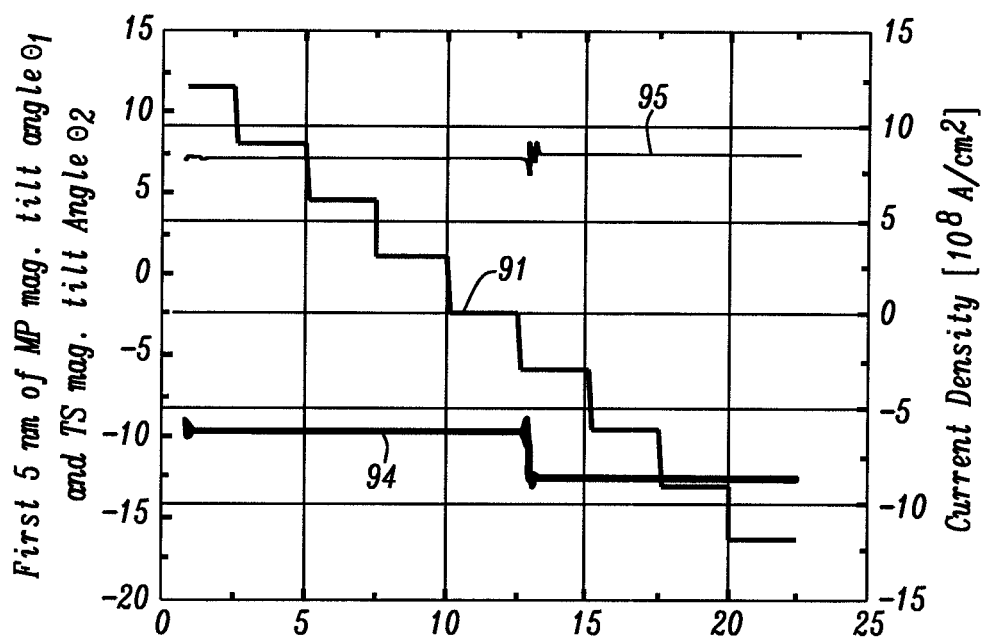
FIG. 19A shows plots of local MP and TS magnetization tilt angles $\theta_1$ and $\theta_2$, respectively, as a function of time and current density for a STRAMR device of the prior art.

As a comparative example, a similar plot of tilt angle $\theta_1$ for the first 5 nm of MP magnetization (curve 94) and tilt angle $\theta_2$ for the first 5 nm of TS magnetization (curve 95) at a MP/STRAMR interface and STRAMR/TS interface, respectively, is plotted in FIG. 19A and relates to the STRAMR reference (U.S. Pat. No. 6,785,092) mentioned earlier. The STRAMR assist is calculated using a spin polarization P0=0.4. Assuming spin torque is only from a spin polarizer (SP) layer to a flux guiding layer with an 8 nmTesla(T) flux density, the flux guiding layer magnetization would flip completely (180 degree reversal in direction) with an applied current density of $-3\times10^8$ A/cm$^2$, and the tilt angles $\theta_1$ and $\theta_2$ show a substantially smaller change per $10^8$ Amps/cm$^2$ change in current density than in the SHAMR example. We calculate that the first 5 nm of MP magnetization is tilted only 1.6 degrees, and the first five nm of TS magnetization is tilted only 0.15 degrees using an $I_a$ with $a-3\times10^8$ A/cm$^2$ current density.

Figure 19B:
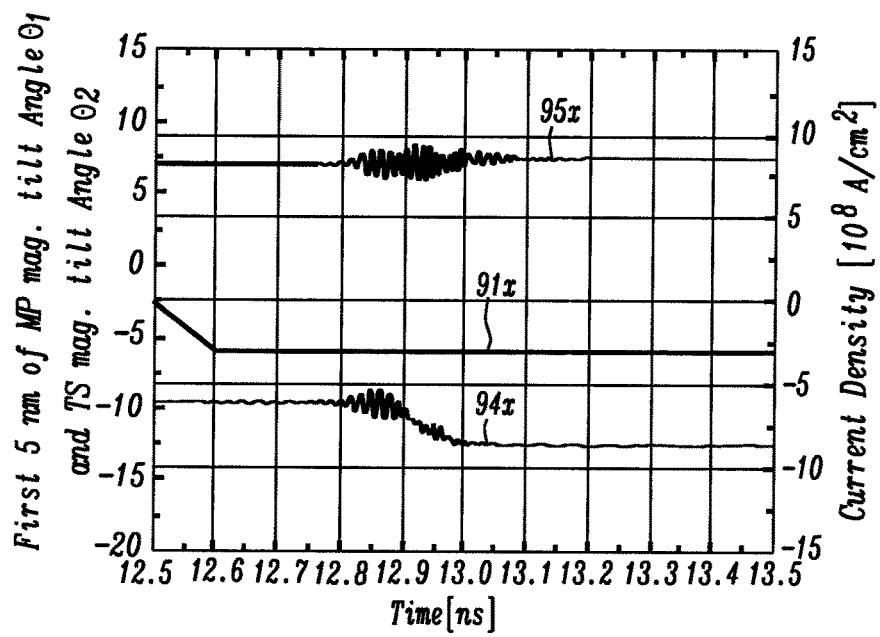
FIG. 19B is a portion of FIG. 19A at time 12.5-13.5 ns.

FIG. 19B plots the response time in terms of ns for a change in the tilt angles as the current density is adjusted for the STRAMR example. After the current density is turned on at 12.6 ns on curve 91x, there is no magnetization flipping in the flux guiding layer until 12.8 ns according to curve 94x and curve 95x that are 1 ns sections of curve 94 and curve 95, respectively. Not only is there no response in the flux guiding layer for 0.2 ns after the current density change, another 0.2 ns is required until the magnetization completely flips to the opposite direction at 13.0 ns. This result indicates the time necessary for flux guiding layer magnetization reversal is in a sub-ns time scale, and significantly longer than the 1 ps to plurality of ps SHAMR assist response time of the present disclosure.

Figure 20A:
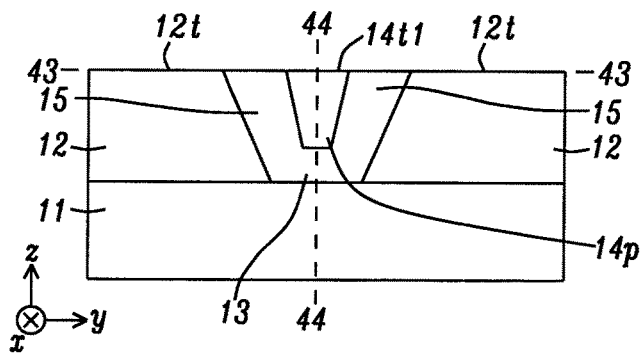
FIG. 20A and FIG. 20B show an ABS view and down-track cross-sectional view, respectively, of a first step in the process of forming a SHAMR device of the present disclosure where a tapered trailing side is formed on the main pole.

The present disclosure also encompasses a process sequence for fabricating SHE1 and SHE2 in a write gap according to an embodiment described herein and is illustrated in FIGS. 20A-28. The partially formed SHAMR device comprising MP 14 that adjoins side gaps 15 and leading gap 13 in FIG. 20A is provided according to a conventional process sequence that is not described herein. Side shield top surfaces 12t are covered with WG layer 16a having top surface 16t that is coplanar with a front edge of the MP tapered trailing side 14t1. Side shields 12 have an outer side 12s1 and 12s2 on opposite sides of center plane 44-44.

Figure 20B:
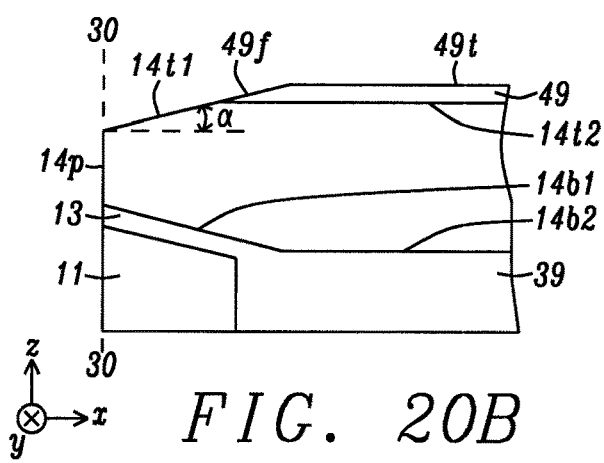

FIG. 20B shows a down-track cross-sectional view of the SHAMR structure in FIG. 20A. MP trailing side 14t1 has taper angle $\alpha$ that is typically >0 degrees. Dielectric layer 49 is formed on MP top surface 14t2 and has a tapered front side 49f that is coplanar with the MP trailing side, and connects with dielectric layer top surface 49t. The dielectric layer may be comprised of a metal oxide.

Figure 21:
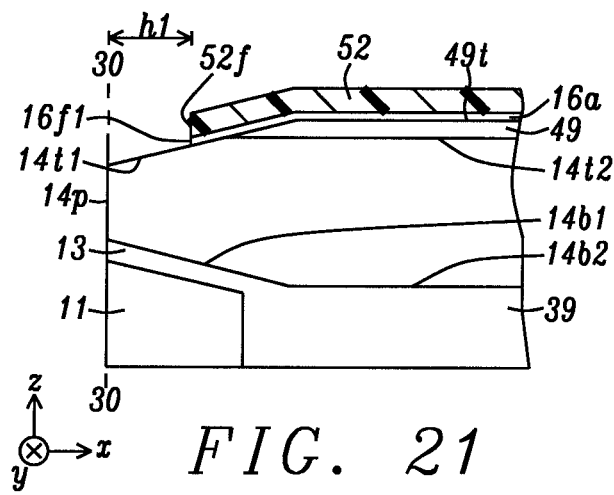
FIG. 21 shows an ABS view of the writer structure in FIG. 20A after a first WG layer is deposited on the MP trailing side, and a first photoresist mask is used to remove a front portion of the first WG layer from the ABS plane to height h1.

Referring to FIG. 21, WG layer 16a is deposited on MP trailing side 14t1 and on dielectric layer 49. A first photoresist layer is coated on the WG layer and is patternwise exposed and developed with a photolithography process to form first photoresist mask 52 with front side 52f at height h1 from the eventual ABS plane 30-30. It should be understood that the ABS will not be determined until a backend lapping process is performed after all PMR writer layers are formed. A first ion beam etch (IBE) or reactive ion etch (RIE) is used to remove a front portion of WG layer 16a up to height h1 thereby forming WG front side 16f1.

Figure 22:
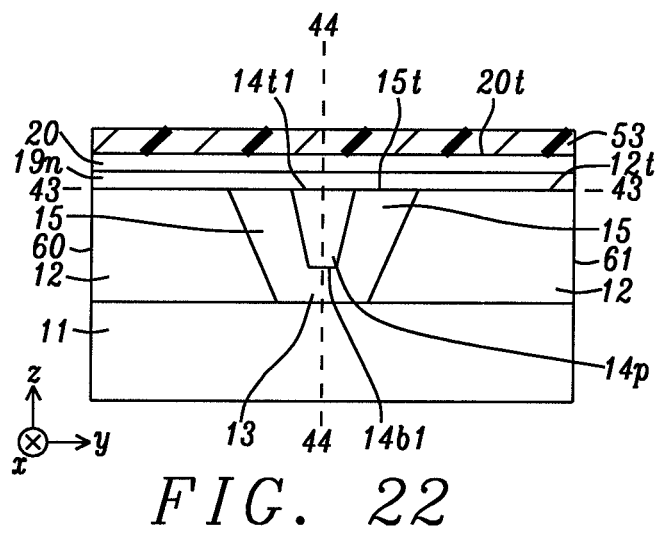
FIG. 22 is an ABS view of the writer structure in FIG. 21 after the first photoresist mask is removed, and SHE1 and conductor layer are sequentially deposited, and then a second photoresist mask is formed on the conductor layer.

In FIG. 22, the partially formed PMR writer is depicted after the first photoresist mask is removed, and SHE1 19n and conductor layer 20 are sequentially deposited on MP trailing side 14t1 and WG layer 16a (not shown). A second photoresist layer is deposited on the conductor layer and is patternwise exposed and developed to form second photoresist mask 53 that has a full width between sides 60, 61 of the PMR writer structure.

Figure 23:
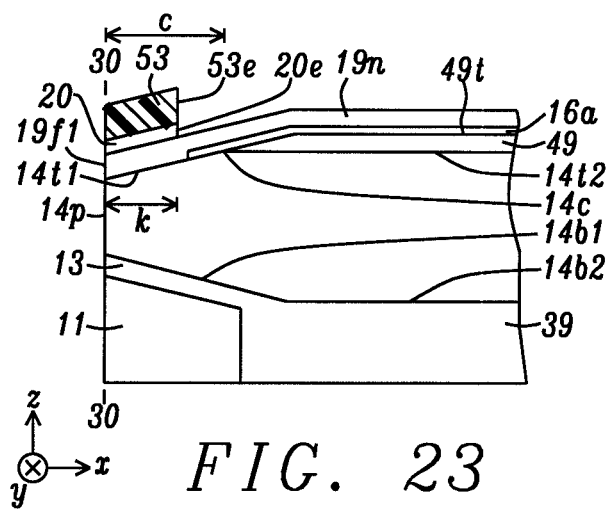
FIG. 23 is a down-track cross-sectional view of the writer structure in FIG. 22 after an IBE or RIE process is used to remove portions of the conductor layer that are not protected by the second photoresist mask and form a backside at height k.

FIG. 23 is a down-track cross-sectional view of the PMR writer structure in FIG. 22 that shows the second photoresist mask 53 has backside 53e at height k from the plane 30-30. A second IBE or RIE process is employed to remove a back portion of conductor layer 20 thereby generating a conductor backside 20e at height k. Preferably k is less than height c, which is the distance between plane 30-30 and the junction of the MP trailing side 14t1 and MP top surface 14t2.

Figure 24:
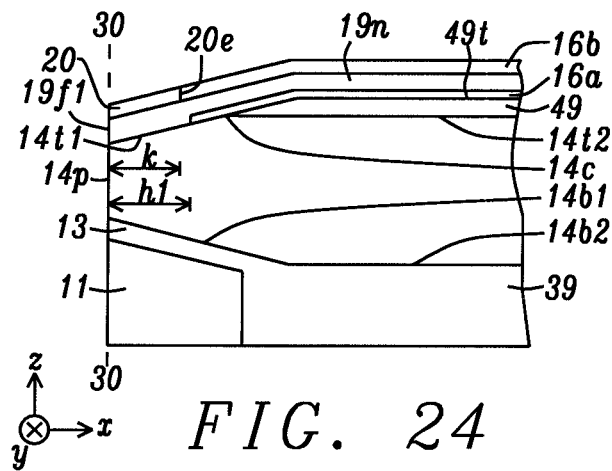
FIG. 24 is a down-track cross-sectional view of the writer structure in FIG. 23 after a second WG layer is deposited and the second photoresist mask is removed.

Referring to FIG. 24, the PMR writer structure in FIG. 23 is shown after WG layer 16b is deposited on SHE1 19n behind the conductor layer backside 20e. Then the second photoresist mask is removed. Height k is typically less than h1.

Figure 25:
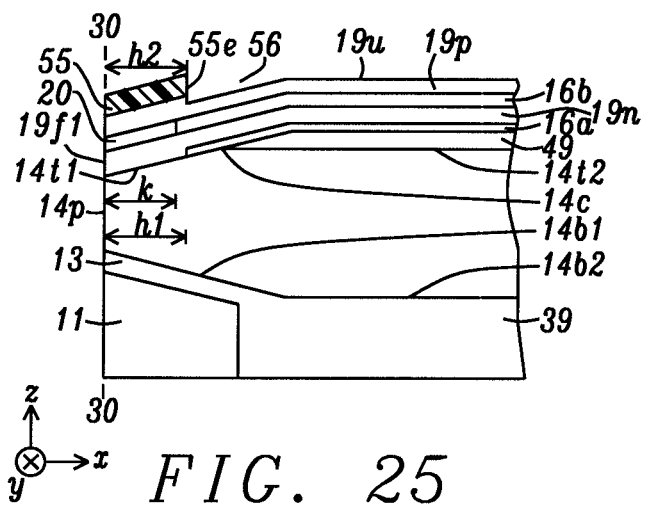
FIG. 25 is an down-track cross-sectional view of the writer structure in FIG. 24 after SHE2 is deposited on the second WG layer and on the conductor layer, and then a third photoresist mask is used during an etch that removes a top section of a SHE2 back portion to define height h2.

Thereafter, as shown in FIG. 25, SHE2 19p is deposited on conductor layer 20, and on WG layer 16b (not shown). A third photoresist mask 55 is formed on SHE2 with a photolithography method and has backside 55e at height h2 from plane 30-30. An IBE or RIE process is used to remove a top portion of SHE2 that is below opening 56 and is not protected by the third photoresist mask, and stops within the SHE2 to form SHE2 top surface 19u.

Figure 26:
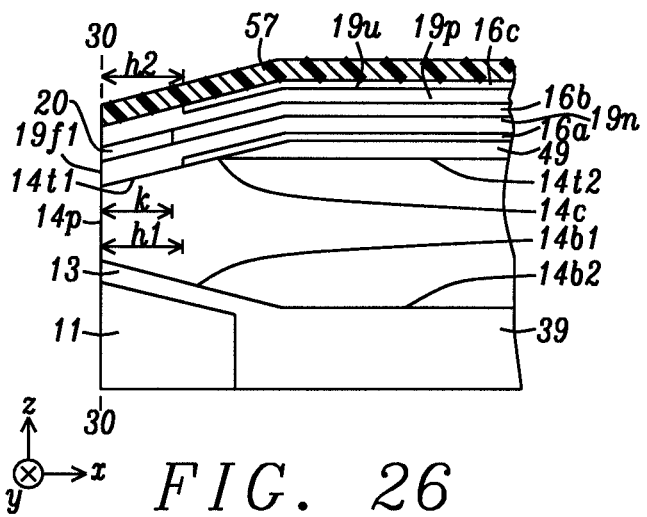
FIG. 26 is a down-track cross-sectional view of the writer in FIG. 25 after a third WG layer (back refill) is deposited on the etched portion of SHE2, the third photoresist mask is removed, and then a fourth photoresist mask is formed on the third WG layer and SHE2 to define a cross-track dimension in the SHAMR device.

Referring to FIG. 26, third WG layer 16c (top oxide refill) is deposited on the SHE2 top surface behind third photoresist backside 55e, and then the third photoresist mask is removed. Next, a fourth photoresist mask 57 is formed on SHE2 19p and the third WG layer, and will be used to define the cross-track width of the SHAMR device.

Figure 27:
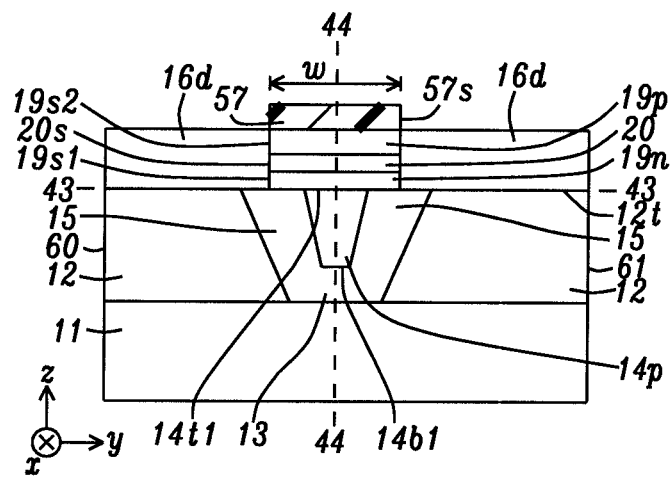
FIG. 27 is an ABS view of the writer structure in FIG. 26 after an IBE or RIE process is used to remove portions of SHE1, the conductor layer, and SHE2 that are not protected by the fourth photoresist mask, and then a fourth WG layer is deposited as a side refill.

In FIG. 27, an IBE or RIE process is employed to remove exposed regions of SHE2 19p, conductor layer 20, and SHE1 19n that are not protected by the fourth photoresist mask 57 with sides 57s that are each ½ w from center plane 44-44. As mentioned earlier, w is preferably ≥the track width of MP trailing side 14t1. The etch stops on SS top surface 12t or on the top surface of WG layer 16a in alternative embodiment (not shown) where WG layer 16a is below plane 43-43. As a result, the SHAMR device comprised of SHE1 with sides 19s1, the conductor layer with sides 20s, and SHE2 having sides 19s2, has the width w.

Figure 28:
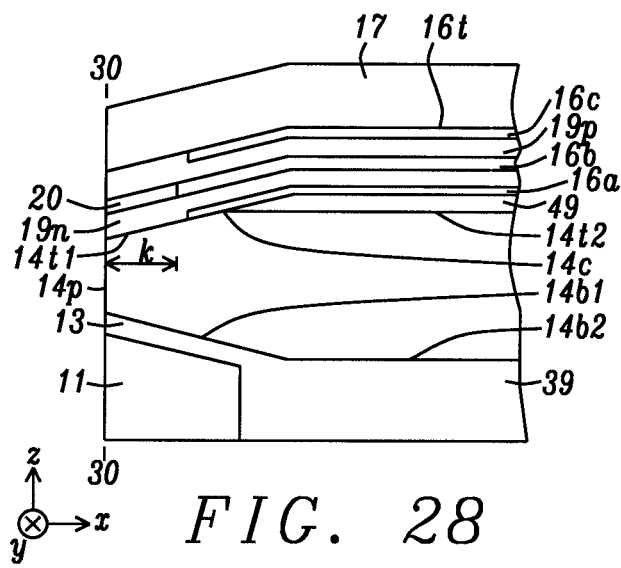
FIG. 28 is a down-track cross-sectional view of the writer in FIG. 27 after the fourth photoresist mask is removed, and the TS is deposited on a front portion of SHE2 and on the third WG layer.

Referring to FIG. 28, fourth WG layer 16d (side oxide refill) is deposited and adjoins the sides of the SHAMR device, and then the fourth photoresist mask is removed with a conventional process. Thereafter, TS 17 is plated on a front portion of SHE2 19p and on WG layer 16c. Finally, a conventional sequence of steps is employed to complete overlying layers in the PMR writer. A lapping process is performed to form the ABS at plane 30-30 and yield the PMR writer shown in FIG. 7A with a SHAMR configuration.

It should be understood that the SHAMR structure of the second embodiment may be formed using the same process flow described with regard to FIG. 20A-FIG. 27 except the positions of SHE1 19n and SHE2 19p are switched. Note that for the fourth embodiment (FIG. 10) and sixth embodiment (FIG. 12), steps that involve depositing and patterning a second SHE layer (SHE2 or SHE1) on the conductor 20 followed by a top oxide refill are omitted. Furthermore, for the eighth embodiment (FIG. 14) and tenth embodiment (FIG. 16), steps involving depositing the bottom oxide (WG 16a) and depositing and patterning the first SHE layer (SHE2 or SHE1) are omitted since the conductor is formed on the MP trailing side. In other embodiments where WG layer 16a separates a conductor extension 20x from the MP trailing side 14t1, the steps of patterning the bottom oxide and depositing a first SHE layer are omitted. For the embodiments where WG layer 16c separates the conductor extension 20x from the TS bottom surface 17b, the steps of depositing, patterning, and etching a second SHE layer are omitted.

In all SHAMR device embodiments described herein, kilo flux change per inch (kFCI) and area density capability (ADC) are expected to improve with one or both of MP write field enhancement (better overwrite property), and enhanced TS return field (better BER). Moreover, all embodiments avoid protrusion of SHE1 and SHE2 when $I_a$ is applied so that reliability concern due to wear is eliminated when the head is flying above the medium. Finally, the design described in the embodiments of the present disclosure is more readily implemented in a read-write head than earlier SHAMR devices that require synchronization of a write current with $I_1$ and $I_2$ through the SHE layers.

While the present disclosure has been particularly shown and described with reference to, the preferred embodiments thereof, it will be understood by those skilled in the art that various changes in form and details may be made without departing from the spirit and scope of this disclosure.

I claim:

1. A Spin Hall Effect (SHE) assisted magnetic recording (SHAMR) structure, comprising:
   (a) a main pole (MP) having a MP tip with a front side at an air bearing surface (ABS), and with a local magnetization that is proximate to a MP trailing side and substantially in a direction of a write gap (WG) flux field between the MP tip and a trailing shield (TS) and across a WG;
   (b) the trailing shield (TS) with a front side at the ABS, and a local magnetization proximate to a bottom surface that faces the MP trailing side, and substantially in a direction of the WG flux field;
   (c) a first Spin Hall Effect layer (SHE1) formed in the WG, and comprised of a negative Spin Hall Angle (SHA) material;
   (d) a conductor layer made of a non-magnetic metal that contacts SHE1; and
   (e) a second Spin Hall Effect layer (SHE2) comprised of a positive SHA material and formed in the WG, and adjoining the conductor layer to give a SHAMR device having a SHE1/conductor layer/SHE2 or a SHE2/conductor layer/SHE1 configuration, and wherein the SHE1 is configured to generate a first transverse spin transfer torque that tilts one of the local MP magnetization and local TS magnetization to a direction that enhances a MP write field and increases a TS return field, respectively, and wherein the SHE2 is configured to generate a second transverse spin transfer torque that tilts the other of the local MP magnetization and local TS magnetization when a current ($I_a$) flows from SHE1 across the conductor layer to SHE2.

2. The SHAMR structure of claim 1 wherein each of SHE1 and SHE2 has a down-track thickness less than 12 nm.

3. The SHAMR structure of claim 1 wherein each of SHE1 and SHE2 has an absolute value for SHA that is ≥0.05, and the conductor layer has a SHA value<0.05.

4. The SHAMR structure of claim 1 wherein the SHAMR device has the SHE1/conductor layer/SHE2 configuration, and a front portion of SHE1 adjoins the MP trailing side between the ABS and a first height (h1), and a front portion of SHE2 adjoins the TS bottom surface between the ABS and a second height (h2).

5. The SHAMR structure of claim 1 wherein the SHAMR device has the SHE2/conductor layer/SHE1 configuration, and a front portion of SHE2 adjoins the MP trailing side from the ABS to a first height (h1), and a front portion of SHE1 contacts the TS bottom surface from the ABS to a second height (h2).

6. The SHAMR structure of claim 4 wherein each of h1 and h2 is from 10 nm to 70 nm.

7. The SHAMR structure of claim 5 wherein each of h1 and h2 is from 10 nm to 70 nm.

8. The SHAMR structure of claim 1 wherein said SHAMR structure is configured such that $I_a$ has no threshold current density requirement in order for SHE1 and SHE2 to generate the first and second transverse spin transfer torque, respectively.

9. The SHAMR structure of claim 1 wherein the conductor layer is one of Ru, Ti, Zr, and Hf.

10. A head gimbal assembly (HGA), comprising:
(a) the SHAMR structure of claim 1; and
(b) a suspension that elastically supports the SHAMR structure, wherein the suspension has a flexure to which the SHAMR structure is joined, a load beam with one end connected to the flexure, and a base plate connected to the other end of the load beam.

11. A magnetic recording apparatus, comprising:
(a) the HGA of claim 10;
(b) a magnetic recording medium positioned opposite to a slider on which the SHAMR structure is formed;
(c) a spindle motor that rotates and drives the magnetic recording medium; and
(d) a device that supports the slider, and that positions the slider relative to the magnetic recording medium.

* * * * *